US012677614B2

(12) United States Patent (10) Patent No.: US 12,677,614 B2
Lee et al. (45) Date of Patent: Jul. 7, 2026

(54) PLASMA EDGE RING, PLASMA ETCHING APPARATUS INCLUDING THE SAME, AND PLASMA ETCHING METHOD USING THE SAME

(71) Applicant: Samsung Electronics Co., Ltd., Suwon-si (KR)

(72) Inventors: Hyunjoo Lee, Suwon-si (KR); Sang Ki Nam, Seongnam-si (KR); Young Hyun Jo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 827 days.

(21) Appl. No.: 17/865,773

(22) Filed: Jul. 15, 2022

(65) Prior Publication Data

US 2023/0142436 A1 May 11, 2023

(30) Foreign Application Priority Data

Nov. 11, 2021 (KR) ........................ 10-2021-0154720

(51) Int. Cl.
| | |
|---|---|
| *C23C 16/00* | (2006.01) |
| *H01J 37/32* | (2006.01) |
| *H10P 50/24* | (2026.01) |
| *H10P 72/00* | (2026.01) |

(52) U.S. Cl.
CPC ...... *H10P 50/242* (2026.01); *H01J 37/32449* (2013.01); *H01J 37/32532* (2013.01); *H01J 37/32642* (2013.01); *H10P 72/04* (2026.01)

(58) Field of Classification Search
CPC ........... H01J 37/32532; H01J 37/32642; H01J 37/32623; H01J 37/32633; H01J 37/32651; H01J 37/32715; H01L 21/68735; H10P 72/04; H10P 72/0418; H10P 72/0421
See application file for complete search history.

(56) References Cited

U.S. PATENT DOCUMENTS

| | | | |
|---|---|---|---|
| 6,020,592 A | 2/2000 | Liebert et al. | |
| 7,767,054 B2 | 8/2010 | Kobayashi et al. | |
| 8,334,657 B2 | 12/2012 | Xia | |
| 9,467,141 B2 | 10/2016 | Lundstrum et al. | |
| 9,490,107 B2 | 11/2016 | Kim et al. | |
| 10,134,605 B2 | 11/2018 | Guha | |
| 2004/0139917 A1* | 7/2004 | Yamaguchi | ......... C23C 16/4585 |
| | | | 118/728 |

(Continued)

FOREIGN PATENT DOCUMENTS

| | | |
|---|---|---|
| JP | 2005260011 A | 9/2005 |
| JP | 2006-245510 A | 9/2006 |

(Continued)

*Primary Examiner* — Luz L Alejandro Mulero
(74) *Attorney, Agent, or Firm* — Harness, Dickey & Pierce, P.L.C.

(57) ABSTRACT

Disclosed are plasma edge rings, plasma etching apparatuses, and plasma etching methods. The plasma etching apparatus comprises a plasma electrode, a plasma edge ring on the plasma electrode, and a guide electrode outside an etching target on the plasma electrode. The plasma edge ring provides a placement hole that vertically penetrates a center of the plasma edge ring, and a recess on a portion of an inner lateral surface that defines the placement hole. The recess is outwardly recessed from the inner lateral surface.

12 Claims, 22 Drawing Sheets

(56)          References Cited

U.S. PATENT DOCUMENTS

2006/0102288 A1 *  5/2006  Satoh ................ H01L 21/67069
                                                156/345.47
2006/0196605 A1    9/2006  Ikegami et al.
2007/0000611 A1    1/2007  Shannon et al.
2007/0215279 A1 *  9/2007  Koshiishi .......... H01J 37/32642
                                                156/914
2013/0235357 A1    9/2013  Delgado et al.
2017/0018411 A1 *  1/2017  Sriraman .......... H01J 37/32495
2018/0025891 A1 *  1/2018  Marakhtanov .... H01J 37/32568
                                                438/714
2020/0402776 A1   12/2020  Rogers et al.
2021/0249233 A1 *  8/2021  Kajifusa ........... H01L 21/31116

FOREIGN PATENT DOCUMENTS

JP      2006-319043  A    11/2006
KR      2007-0015031  A    2/2007
KR      2009-0026321  A    3/2009
KR      2010-0092348  A    8/2010

* cited by examiner

PLASMA EDGE RING, PLASMA ETCHING APPARATUS INCLUDING THE SAME, AND PLASMA ETCHING METHOD USING THE SAME

CROSS-REFERENCE TO RELATED APPLICATION

This U.S. nonprovisional application claims priority under 35 U.S.C § 119 to Korean Patent Application No. 10-2021-0154720 filed on Nov. 11, 2021 in the Korean Intellectual Property Office, the disclosure of which is hereby incorporated by reference in its entirety.

BACKGROUND

The present inventive concepts relate to plasma edge rings, plasma etching apparatuses including the same, and plasma etching methods using the same, and more particularly, to plasma edge rings configured to control a mask backside etching, plasma etching apparatuses including the same, and plasma etching methods using the same.

A semiconductor device may be fabricated through various processes. For example, the semiconductor device may be manufactured by photolithography process, an etching process, and a deposition process performed on a silicon wafer. A mask may be used to form patterns in a photolithography process for fabricating a semiconductor device. The mask may be manufactured in various methods. For example, an etching process may be used to manufacture the mask.

SUMMARY

Some example embodiments of the present inventive concepts provide a plasma edge ring configured to reduce a mask backside etching, a plasma etching apparatus including the same, and/or a plasma etching method using the same.

Some example embodiments of the present inventive concepts provide a plasma edge ring configured to control an ion flow, a plasma etching apparatus including the same, and/or a plasma etching method using the same.

Some example embodiments of the present inventive concepts provide a plasma edge ring configured to increase a manufacturing yield, a plasma etching apparatus including the same, and/or a plasma etching method using the same.

The object of the present inventive concepts is not limited to the mentioned above, and other objects which have not been mentioned above will be clearly understood to those skilled in the art from the following description.

According to some example embodiments of the present inventive concepts, a plasma etching apparatus may comprise: a plasma electrode; a plasma edge ring on the plasma electrode; and a guide electrode outside an etching target on the plasma electrode. The plasma edge ring may include an inner sidewall surface that may include a first surface portion that at least partially defines a placement hole that vertically penetrates a center of the plasma edge ring, and a second surface portion that at least partially defines a recess on a portion of an inner lateral surface that is recessed away from the center of the plasma edge ring in relation to the first surface portion of the inner sidewall surface, for example such that the recess is further away from the center of the plasma edge ring than at least a portion of the first surface portion that is adjacent to the second surface portion.

According to some example embodiments of the present inventive concepts, a plasma etching apparatus may comprise: a plasma electrode; a support member on a top surface of the plasma electrode; a plasma edge ring that surrounds the support member; a guide electrode; a plasma voltage supply that is configured to apply a first voltage to the plasma electrode; and a guide voltage supply that is configured to apply a second voltage to the guide electrode. The guide electrode may be outside the support member.

According to some example embodiments of the present inventive concepts, a plasma etching ring may comprise a plate body having a central axis that extends vertically. The plate body may include an inner sidewall surface including a first surface portion that at least partially defines a placement hole that vertically penetrates the central axis of the plate body; and a second surface portion that at least partially defines a recess that is recessed away from the center of the plasma edge ring in relation to the first surface portion of the inner sidewall surface, for example such that the recess is further away from the center of the plate body than at least a portion of the first surface portion that is adjacent to the second surface portion and is recessed into an interior of the plate body. A recess top surface may be beneath a top surface of the plate body. The second surface portion may include a recess top surface that may define a portion of the recess.

According to some example embodiments of the present inventive concepts, a plasma etching method may comprise: placing an etching target into a plasma etching apparatus; supplying the plasma etching apparatus with a process gas; applying a first voltage to a guide electrode; and applying a second voltage to a plasma electrode. The step of placing the etching target into the plasma etching apparatus may include inserting the etching target into a placement hole at least partially defined by an inner sidewall surface a plasma edge ring to dispose the etching target on the plasma electrode. The guide electrode may be outside the etching target.

Details of some example embodiments are included in the description and drawings.

DETAILED DESCRIPTION

Figure 1A:
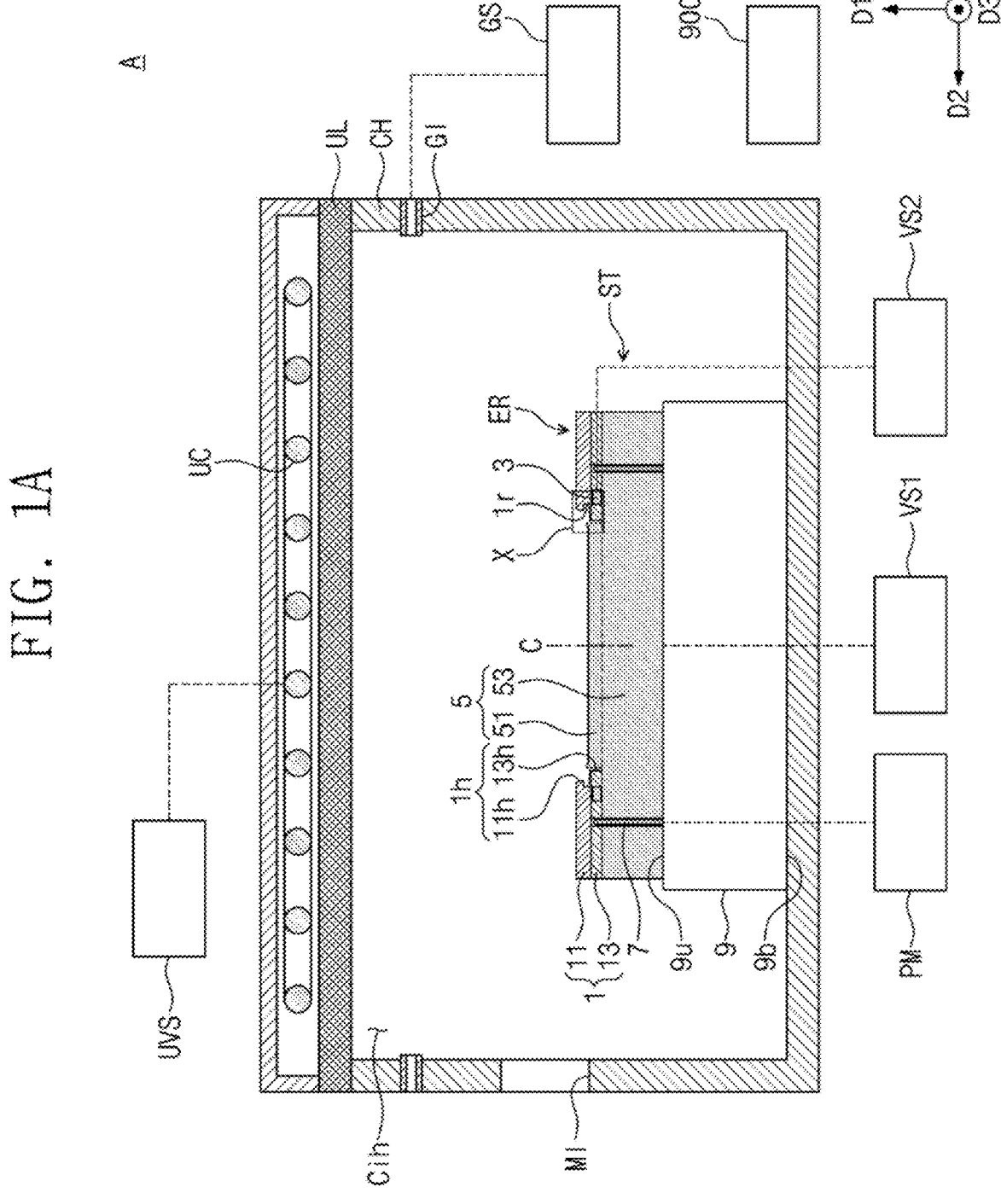
FIG. 1A illustrates a cross-sectional view showing a plasma etching apparatus according to some example embodiments of the present inventive concepts.

The following will now describe some example embodiments of the present inventive concepts with reference to the accompanying drawings. Like reference numerals may indicate like components throughout the description.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1A illustrates a cross-sectional view showing a plasma etching apparatus according to some example embodiments of the present inventive concepts.

In this description, symbol D1 may indicate a first direction, symbol D2 may indicate a second direction that intersects the first direction D1, and symbol D3 may indicate a third direction that intersects each of the first and second directions D1 and D2. The first direction D1 may be called an upward direction, and a direction reverse to the first direction D1 may be called a downward direction. In addition, the first direction D1 may be called a vertical direction, and each of the second and third directions D2 and D3 may be called a horizontal direction.

Referring to FIG. 1A, a plasma etching apparatus A may be provided. The plasma etching apparatus A may be configured such that plasma is used to etch an etching target. The plasma etching apparatus A may etch various etching targets. For example, the plasma etching apparatus A may etch a wafer or a mask. The plasma etching apparatus A may etch one surface of a wafer or a mask to form a pattern on the wafer or the mask. The mask may mean a photomask. For example, the mask may include an extreme ultraviolet (EUV) photomask used from an EUV photolithography process that use an extreme ultraviolet (EUV) radiation. The present inventive concepts, however, are not limited thereto, and the mask may mean a mask used for different processes other than the EUV photolithography process.

The plasma etching apparatus A may use various modes to generate the plasma to etch the etching target. For example, the plasma etching apparatus A may generate the plasma by using a capacitively coupled plasma (CCP) mode, an inductively coupled plasma (ICP) mode, or a magnetically enhanced reactive ion etching (MERIE) mode. The following description will focus on the plasma etching apparatus A based on the ICP mode for the purpose of convenience of explanation.

The plasma etching apparatus A may include a chamber housing CH, a stage ST, a plasma voltage supply VS1, a guide voltage supply VS2, a gas supply GS, a pin driver PM, an upper electrode UC, an upper layer UL, and an upper voltage supply UVS.

The chamber housing CH may provide an internal space Cih. The stage ST may be positioned in the internal space Cih. The etching target may be etched with the plasma in a state that the etch-target is disposed on the stage ST in the internal space Cih. The chamber housing CH may provide a gas inlet GI and an etching-target inlet MI. The gas inlet GI may be connected to the gas supply GS. A process gas provided from the gas supply GS may be introduced through the gas inlet GI into the internal space Cih. The gas introduced into the internal space Cih may be converted into the plasma. A detailed description thereof will be further discussed below. The gas inlet GI may be provided in plural. A plurality of gas inlets GI may be disposed spaced apart from each other in a horizontal direction. The present inventive concepts, are not, limited thereto, and differently from that shown, the gas inlet GI may be shaped like a shower head. Depending on whether the etching-target inlet MI is opened or not, the internal space Cih may be connected to outside. The etching target may be introduced through the etching-target inlet MI into the internal space Cih. For example, a robot arm (not shown) may cause the etching target, such as wafer or mask, to lie on the stage ST after passing through the etching-target inlet MI.

The stage ST may be disposed in the chamber housing CH. The stage ST may support the etching target. For example, a wafer or a mask may be etched while being loaded on the stage ST. The stage ST may include a lower supporter 9, a plasma electrode 5, a lift pin 7, a guide electrode 3, and a plasma edge ring ER.

The lower supporter 9 may support the plasma electrode 5. Various components may be positioned within the lower supporter 9. For example, the lower supporter 9 may be provided therein with a voltage delivery member, a lift pin driving member, a heating member, a thermal transfer gas supply path, and the like.

The plasma electrode 5 may generate an electric field and/or a magnetic field to create the plasma from a process gas introduced into the internal space Cih. Alternatively, the plasma electrode 5 may generate an electric field and/or a magnetic field to control behavior of the plasma. The plasma electrode 5 may include a conductive material. For example, the plasma electrode 5 may include a metallic material. The plasma electrode 5 may be connected to the plasma voltage supply VS1. The plasma electrode 5 may include a plateau 51 and an electrode body 53. The plateau 51 may be positioned on the electrode body 53. A length in a horizontal direction of the plateau 51 may be less than that of the electrode body 53. The etching target may be disposed on the plateau 51. The electrode body 53 may be positioned beneath the plateau 51. A detailed description thereof will further discussed below.

The lift pin 7 may raise and lower the etching target. For example, the lift pin 7 may unload a wafer or a mask from a robot arm, and may load the wafer or the mask on the stage ST. Alternatively, the lift pin 7 may raise a wafer or a mask disposed on the stage ST, and may move the wafer or the mask onto a robot arm. The lift pin 7 may vertically extend. In addition, the lift pin 7 may move up and down. For example, the lift pin 7 may be connected to the pin driver PM, and the pin driver PM may drive the lift pin 7 to ascend and descend. The lift pin 7 may penetrate the plasma electrode 5 and optionally a portion of the plasma edge ring ER. The lift pin 7 may be provided in plural. For example, three lift pins 7 may be provided. For convenience, the following will describe a single lift pin 7.

The guide electrode 3 may partially control behavior of the plasma. For example, the guide electrode 3 may generate an electric field or a magnetic field to guide a flow of ion particles. The guide electrode 3 may include a conductive material. For example, the guide electrode 3 may include a metallic material similar to that of the plasma electrode 5. The guide electrode 3 may be positioned outside the etching target disposed on the plasma electrode 5. For example, the guide electrode 3 may be positioned outside the plateau 51. For more detail, the guide electrode 3 may be positioned outside a support member (see 2 of FIG. 1B) which will be discussed below. A detailed description thereof will be further discussed below.

The plasma edge ring ER may surround the etching target disposed on the plasma electrode 5. The plasma edge ring ER may partially control a plasma distribution on the etching target. For example, the plasma edge ring ER may cause the plasma formed in the internal space Cih to concentrate on a top surface of the etching target. The plasma edge ring ER may be disposed on the plasma electrode 5. For example, the plasma edge ring ER may be disposed on the electrode body 53. When viewed in plan, the plasma edge ring ER may surround the plateau 51. The plasma edge ring ER may include a plate body 1. The plate body 1 may include one or more of alumina ($Al_2O_3$), yttria ($Y_2O_3$), and silicon (Si), but the present inventive concepts are not limited thereto.

Figure 1B:
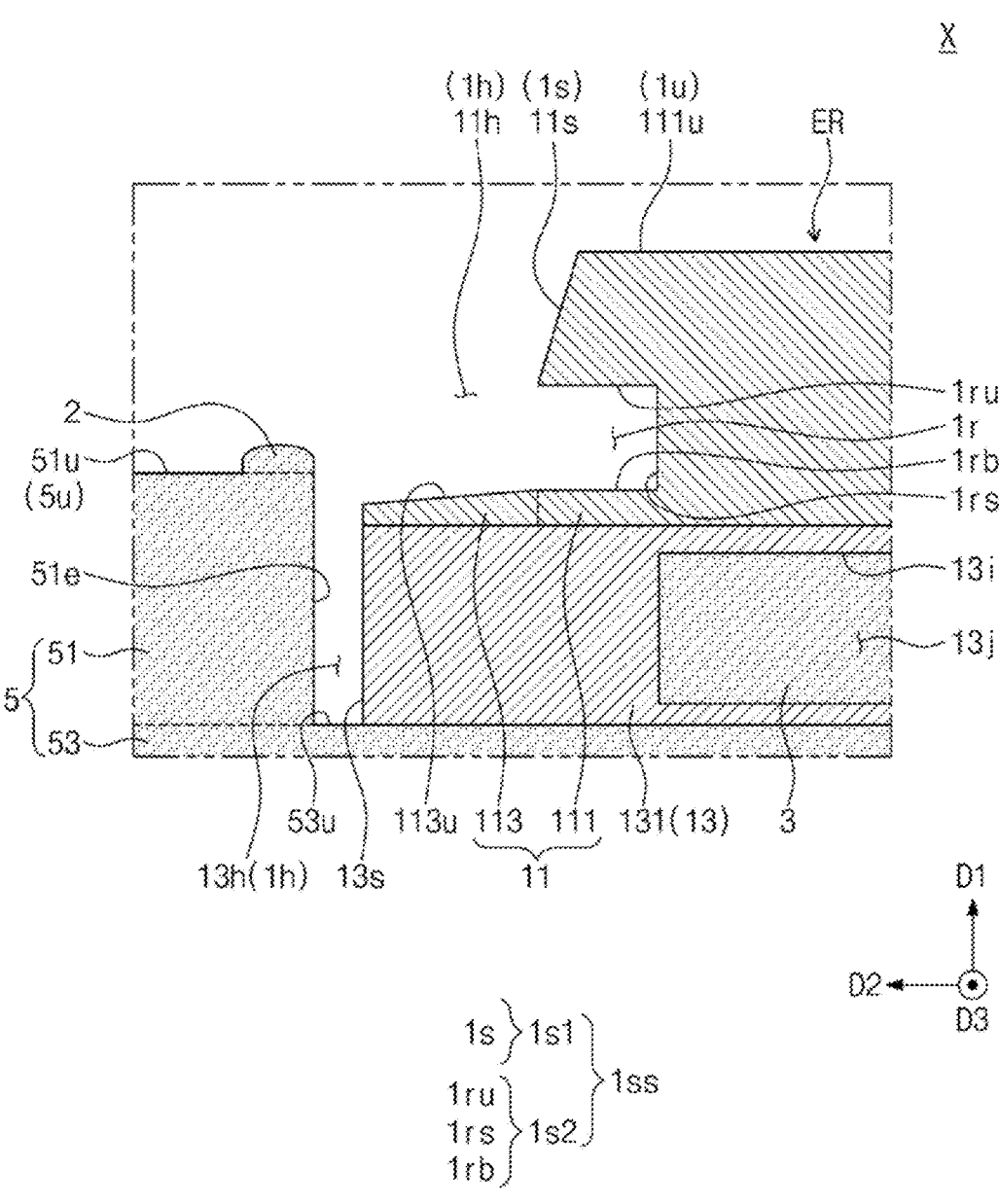
FIG. 1B illustrates an enlarged cross-sectional view showing section X of FIG. 1A.

The plate body 1 may provide a placement hole 1*h* and a recess 1*r*. The placement hole 1*h* may vertically penetrate a center of the plate body 1 (e.g., represented by center C in FIG. 1A, which may also represent the center of the plasma edge ring ER, where center C is represented as a central axis which may represent a central axis of the plate body and/or of the plasma edge ring ER). For example, the placement hole 1*h* may extend in the first direction D1 and may penetrate the plate body 1. The plate body 1, and thus the plasma edge ring ER, may have an inner sidewall surface 1*ss* that at least partially defines the placement hole 1*h*, and a portion of the inner sidewall surface 1*ss* may be outwardly recessed to form the recess 1*r*. For example, the recess 1*r* may be a space that extends outwardly (e.g., away from the center of the plasma edge ring ER in the D2 and/or D3 direction) from the placement hole 1*h*. For example, the inner sidewall surface 1*ss* may include a first surface portion 1*s*1 (e.g., including inner lateral surface is which may be considered to be a portion of inner sidewall surface 1*ss*) that at least partially defines the placement hole 1*h*, and a second surface portion 1*s*2 (e.g., including a recess top surface 1*ru*, a recess lateral surface 1*rs*, and a recess bottom surface 1*rb* that at least partially define the recess 1*r*) that at least partially defines a recess 1*r* that is outwardly recessed from the first surface portion 1*s*1 of the inner sidewall surface 1*ss* (e.g., outwardly recessed from inner lateral surface 1*s*). As shown in FIGS. 1A and 1B, the second surface portion 1*s*2 at least partially defines the recess 1*r* so that the recess 1*r* is outwardly recessed away from the center C of the plasma edge ring ER and/or of the plate body 1 (e.g., outwardly recessed radially and/or recessed away from the center C), so that the recess 1*r* and/or the second surface portion 1*s*2 is further away from the center C of the plasma edge ring ER and/or of the plate body 1 (e.g., in the D2 direction and/or in the D3 direction) than a smallest distance (e.g., in the D2 and/or D3 direction) of the first surface portion 1*s*1 from the center C of the plasma edge ring ER and/or of the plate body 1. Accordingly, the recess 1*r* may be recessed further away from the center C than at least a portion of the first surface portion 1*s*1 (e.g., further away from the center C than at least a portion of the first surface portion 1*s*1 that is closest to the second surface portion 1*s*2 (e.g., the portion of the inner lateral surface is that is adjacent to the recess top surface 1*ru*). Additionally, and as shown in at least FIG. 1B, the recess 1*r* may be understood to be recessed inwardly toward an interior (e.g., internal structure) of the plate body 1. Therefore, the recess 1*r* may be spatially connected to the placement hole 1*h*. The plate body 1 may include a capture ring 11 and a cover ring 13. The capture ring 11 may be positioned on the cover ring 13. The capture ring 11 and the cover ring 13 may be detachable. The capture ring 11 may provide a first placement hole 11*h*. The cover ring 13 may provide a second placement hole 13*h*. The first and second placement holes 11*h* and 13*h* may be spatially connected to form the placement hole 1*h*. The recess 1*r* may be provided in the capture ring 11. A detailed description thereof will be further discussed below with reference to FIG. 2.

The plasma voltage supply VS1 may be connected to the plasma electrode 5. The plasma voltage supply VS1 may be connected to the plasma electrode 5. For example, the plasma voltage supply VS1 may apply a first voltage to the plasma electrode 5. A radio-frequency (RF) power may be given as power transmitted from the plasma voltage supply VS1 to the plasma electrode 5. The plasma voltage supply VS1 may include components capable of generating and transmitting the RF power.

The guide voltage supply VS2 may be connected to the guide electrode 3. The guide voltage supply VS2 may apply a voltage to the guide electrode 3. For example, the guide voltage supply VS2 may provide the guide electrode 3 with a second voltage different from the first voltage. A radio-frequency (RF) power may be given as power transmitted from the guide voltage supply VS2 to the guide electrode 3. The guide voltage supply VS2 may include components capable of generating and transmitting the RF power. The following will describe in detail the plasma voltage supply VS1 and the guide voltage supply VS2.

The gas supply GS may be connected to the gas inlet GI. The gas supply GS may supply the internal space Cih with a process gas. The process gas may be converted into plasma that etches the etching target. The gas supply GS may include a gas tank, a compressor, and a pipe line.

The pin driver PM may drive the lift pin 7. For example, the pin driver PM may provide power to raise and lower the lift pin 7. The pin driver PM may include an actuator, such as a hydraulic motor or an electric motor.

The upper electrode UC may be positioned on the chamber housing CH. The upper electrode UC may generate an electric field and/or a magnetic field to create the plasma from the process gas in the internal space Cih. The upper electrode UC may have a coil shape, but the present inventive concepts are not limited thereto.

The upper layer UL may be positioned between the upper electrode UC and the chamber housing CH. The upper layer UL may hermetically seal the internal space Cih.

The upper voltage supply UVS may apply power to the upper electrode UC. For example, the upper voltage supply UVS may provide the upper electrode UC with a radio-frequency (RF) power to generate the plasma. The upper voltage supply UVS may include components capable of generating and transmitting the RF power.

Still referring to FIG. 1A, it will be understood that the plasma etching apparatus A according to any of the example embodiments may be communicatively coupled to a control device, referred to herein as a plasma etching apparatus control device 900, which may be an electronic device which may be configured to control the plasma etching apparatus A to perform one or more operations (also referred to herein as steps and/or processes), and/or any operations, of another of the plasma etching methods according to any of the example embodiments, including some or all operations of any of the methods shown in FIGS. 4, 5 to 10, or any combination thereof.

As shown in FIG. 1A, a plasma etching apparatus control device 900 may include a processor, a memory, a power supply (e.g., an AC power supply device), and an interface that are electrically coupled together via a bus. The interface may be a communication interface (e.g., a wired or wireless communication transceiver).

The interface of the plasma etching apparatus control device 900 may be communicatively coupled with one or more portions of the plasma etching apparatus A, but it will be understood that the interface, and thus the plasma etching apparatus control device 900, may be communicatively coupled with one or more portions of the plasma etching apparatus A according to any of the example embodiments. As shown in FIG. 1A, the interface of the plasma etching apparatus control device 900, and thus the plasma etching apparatus control device 900 itself, may be communicatively (e.g., electrically) coupled with one or more portions of the plasma etching apparatus A, including but not limited to the plasma voltage supply VS1, the guide voltage supply VS2, the gas supply GS, the pin driver PM, and the upper voltage supply UVS. The plasma etching apparatus control device 900 may be configured to control (e.g., adjustably control) the operation of some, any, and/or all of the portions of the plasma etching apparatus A to which the plasma etching apparatus control device 900 is communicatively coupled, such that the plasma etching apparatus control device 900 may be configured to control the plasma etching apparatus A to cause one or more operations, steps, processes or the like according to any methods of any of the example embodiments to be performed, including for example some or all operations of any of the methods shown in FIGS. 4, 5 to 10, or any combination thereof.

The memory of the plasma etching apparatus control device 900 may be a non-transitory computer readable storage medium (e.g., a solid-state drive SSD) storing a program of instructions. The processor of the plasma etching apparatus control device 900 (e.g., a central processing unit CPU) may be configured to execute the program of instructions stored at the memory of the plasma etching apparatus control device 900 to cause one or more, or all, of the operations of any of the methods according to any of the example embodiments to be performed (e.g., based on generating a command signal and causing the command signal to be transmitted to one or more portions of the communicatively coupled plasma etching apparatus A via the interface of the plasma etching apparatus control device 900.

In some example embodiments, the plasma etching apparatus A may include an actuator, for example a servo actuator, servo arm, robotic arm, or the like which may be configured to move one or more etching targets EO into and/or out of the plasma etching apparatus A, for example to load one or more etching targets EO on the support member 2.

In some example embodiments, a plasma etching apparatus control device 900 according to any of the example embodiments may be communicatively coupled to one or more portions of the plasma etching apparatus A. The plasma etching apparatus control device 900 may be configured to (based on, for example, the processor of the plasma etching apparatus control device 900 executing a program of instructions stored at the memory of the plasma etching apparatus control device 900) cause one or more operations of any of the methods of the example embodiments to be performed based on generating one or more command signals and transmitting the command signals, and/or selectively and/or adjustably controlling a supply of electrical power, to one or more of the plasma voltage supply VS1, the guide voltage supply VS2, the gas supply GS, the pin driver PM, and the upper voltage supply UVS, or the like of the communicatively coupled plasma etching apparatus A to cause one or more operations to be performed based on operation of the one or more of the plasma voltage supply VS1, the guide voltage supply VS2, the gas supply GS, the pin driver PM, and the upper voltage supply UVS, or the like in response to the one or more command signals.

As described herein, any devices, systems, blocks, modules, units, controllers, circuits, apparatus, and/or portions thereof according to any of some example embodiments (including, without limitation, any of the example embodiments of a plasma etching apparatus, the plasma etching apparatus control device 900, any portion thereof, or the like) may include, may be included in, and/or may be implemented by one or more instances of processing circuitry such as hardware including logic circuits; a hardware/ software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a micro-computer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, apparatuses, and/or portions thereof according to any of some example embodiments, and/or any portions thereof, including for example some or all operations of any of the methods shown in FIGS. 4, 5 to 10, or any combination thereof.

It will be understood that, in some example embodiments, a device manufactured according to any of the example embodiments (e.g., any of the plasma-etching methods) may be incorporated into an electronic device having similar structure as the plasma etching apparatus control device 900 shown in FIG. 1A (e.g., an electronic device, including a processor, memory, power supply, and/or interface communicatively coupled via a bus may include a device manufactured according to any of the example embodiments in any of the processor, memory, power supply, and/or interface of the electronic device).

FIG. 1B illustrates an enlarged cross-sectional view showing section X of FIG. 1A.

Referring to FIG. 1B, a support member 2 may be positioned on the plasma electrode 5. The support member 2 may be positioned on a top surface 5u of the plasma electrode 5. For example, the support member 2 may be located at a higher level than that of a top surface 51u of the plateau 51. The support member 2 may support the etching target while being in contact with the etching target disposed on the plasma electrode 5. The support member 2 may have a curved shape at a top surface thereof, but the present inventive concepts are not limited thereto. When viewed in plan, the support member 2 may have an area less than that of the top surface 51u of the plateau 51. The support member 2 and the plasma electrode 5 may be integrally formed into a single unitary piece, but the present inventive concepts are not limited thereto.

In the present specification, the term 'level' may mean a vertical height and/or a distance from a reference location (e.g., a top surface 9u and/or bottom surface 9b of the lower supporter 9) in a vertical direction (e.g., the first direction D1). For example, when a first element is described herein to be at a level higher than a second element, the first element may be further from the reference location in the vertical direction than the second element. In another example, when a first element is described herein to be at a level lower than a second element, the first element may be closer to the reference location in the vertical direction than the second element. In another example, when a first element is described herein to be at a same level as a second element, the first element may be equally distant from/close to the reference location in the vertical direction as the second element.

The plasma edge ring ER may be disposed on a top surface 53u of the electrode body 53. The plasma edge ring ER may surround the plateau 51. For example, the plateau 51 may be interested into the placement hole 1*h*. The plasma edge ring ER may be outwardly spaced apart from an outer lateral surface 51*e* of the plateau 51. For example, an inner lateral surface 13*s* of the cover ring 13 may be outwardly spaced apart from (e.g., radially outwardly isolated from direct contact with) the outer lateral surface 51*e* of the plateau 51.

An inner lateral surface is of the plasma edge ring ER may be partially and outwardly recessed to form the recess 1*r*. For example, an inner lateral surface 11*s* of the capture ring 11 may be partially and outwardly recessed to form the recess 1*r*. The recess 1*r* may be spatially connected to the placement hole 1*h*. The recess 1*r* may be positioned beneath a top surface 1*u* of the plasma edge ring ER. For example, the recess 1*r* may be downwardly spaced apart from a top surface 111*u* of the capture ring 11. The recess 1*r* may be covered with the top surface 1*u* of the plasma edge ring ER, and thus may be isolated from exposure to an exposure to an exterior of the plasma edge ring ER in a vertical direction (e.g., direction D1) by the top surface 1*u* of the plasma edge ring ER. Therefore, the recess 1*r* may not be exposed on the top surface 1*u* of the plasma edge ring ER.

A portion of the inner lateral surface 11*s* of the capture ring 11 may be outwardly recessed to form a recess top surface 1*ru*, a recess lateral surface 1*rs*, and a recess bottom surface 1*rb* that define the recess 1*r*. The recess top surface 1*ru* may be located at a lower level than that of the top surface 1*u* of the plasma edge ring ER. The recess top surface 1*ru* may be parallel to the second direction D2 and the third direction D3. The recess lateral surface 1*rs* may be parallel to the first direction D1. The recess bottom surface 1*rb* may face the recess top surface 1*ru*. The recess bottom surface 1*rb* may be located at a lower level than that of the support member 2. In addition, the recess bottom surface 1*rb* may be positioned above a bottom surface of the plate body 1. The present inventive concepts, however, are not limited thereto, and the recess bottom surface 1*rb* may be connected to the bottom surface of the plate body 1.

The capture ring 11 may include a capture ring body 111 and a base member 113. The recess 1*r* may be provided in the capture ring body 111. The capture ring body 111 may have a thickness greater than that of the base member 113. The base member 113 may extend inwardly from the capture ring body 111 (e.g., closer to the center C of the plate body 1 and/or of the plasma edge ring ER than the capture ring body 11). The base member 113 may be positioned beneath the recess 1*r*. The base member 113 may have a top surface 113*u* connected to the recess bottom surface 1*rb*. The top surface 113*u* of the base member 113 may have a level that slopes downwardly and inwardly. The present inventive concepts, however, are not limited thereto. A detailed description thereof will be further discussed below.

The guide electrode 3 may be positioned beneath and/or outside the recess 1*r*. For example, as illustrated in FIG. 1B, the guide electrode 3 may be positioned in the cover ring 13. The cover ring 13, and thus the plasma edge ring ER, may include one or more inner surfaces 13*i* that at least partially define a guide electrode insertion hole 13*j* within the plasma edge ring ER. The guide electrode 3 may be positioned in the guide electrode insertion hole 13*j*. The present inventive concepts, however, are not limited thereto, and the position of the guide electrode 3 may be changed. A detailed description thereof will be further discussed below.

Figure 2:
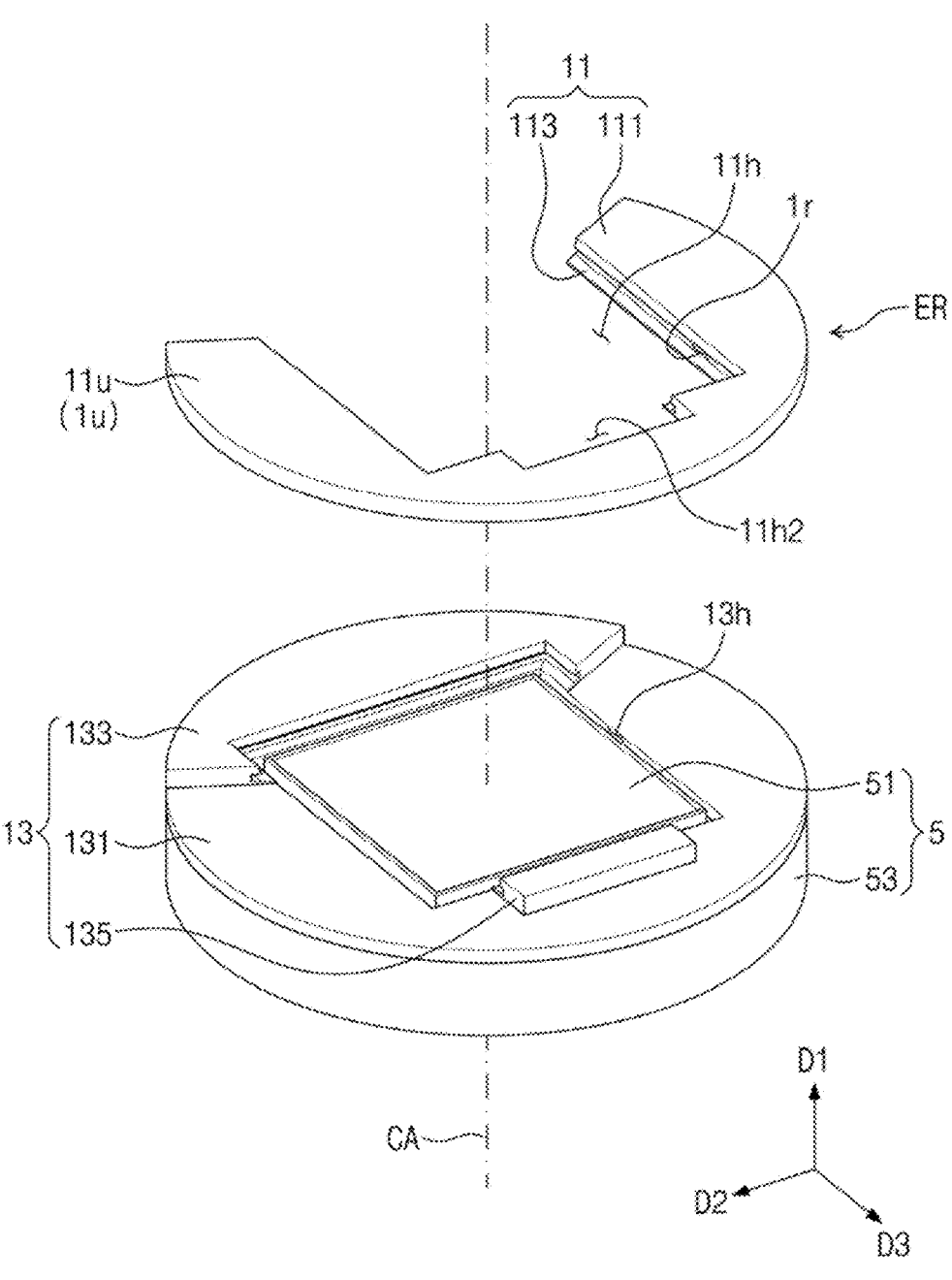
FIG. 2 illustrates a perspective view showing a plasma edge ring and a plasma electrode according to some example embodiments of the present inventive concepts.

FIG. 2 illustrates a perspective view showing a plasma edge ring and a plasma electrode according to some example embodiments of the present inventive concepts.

Referring to FIG. 2, the capture ring 11 may have a circular shape when viewed in plan. The capture ring 11 may have a ring shape whose axis CA is parallel to the first direction D1. When viewed in plan, each of the first and second placement holes 11*h* and 13*h* may have a tetragonal shape. The capture ring 11 may be opened at one side thereof. For example, one side of the first placement hole 11*h* may be opened to outside. For more detail, the first placement hole 11*h* may be opened toward a direction reverse to the third direction D3.

The capture ring 11 may further provide an insertion hole 11*h*2. The insertion hole 11*h*2 may extend in the third direction D3 from the first placement hole 11*h*. The insertion hole 11*h*2 may have a tetragonal shape when viewed in plan. A portion of a robot arm may be inserted into the insertion hole 11*h*2.

The cover ring 13 may include a cover ring body 131, a first insertion member 133, and a second insertion member 135. The cover ring body 131 may have a circular shape when viewed in plan. The cover ring body 131 may have a ring shape with the axis CA. The cover ring body 131 may be positioned on the electrode body 53. The cover ring body 131 may surround the plateau 51. The first insertion member 133 may be inserted into the opened portion of the first placement hole 11*h*. The second insertion member 135 may be inserted into the insertion hole 11*h*2. An inner lateral surface of each of the first and second insertion members 133 and 135 may also be partially and outwardly recessed to form a recess. In a state that the capture ring 11 is rest on the cover ring 13, the recess provided from each of the first and second insertion members 133 and 135 may be connected to the recess (see 1*r* of FIG. 1B) of the capture ring 11. In this case, it appears that four recesses are provided. Each of the four recesses may extend along a horizontal direction. In addition, in a state that the capture ring 11 is rest on the cover ring 13, the top surface 11*u* of the capture ring 11 may be positioned on substantially the same plane on which is positioned a top surface of each of the first insertion member 133 and the second insertion member 135.

Figure 3:
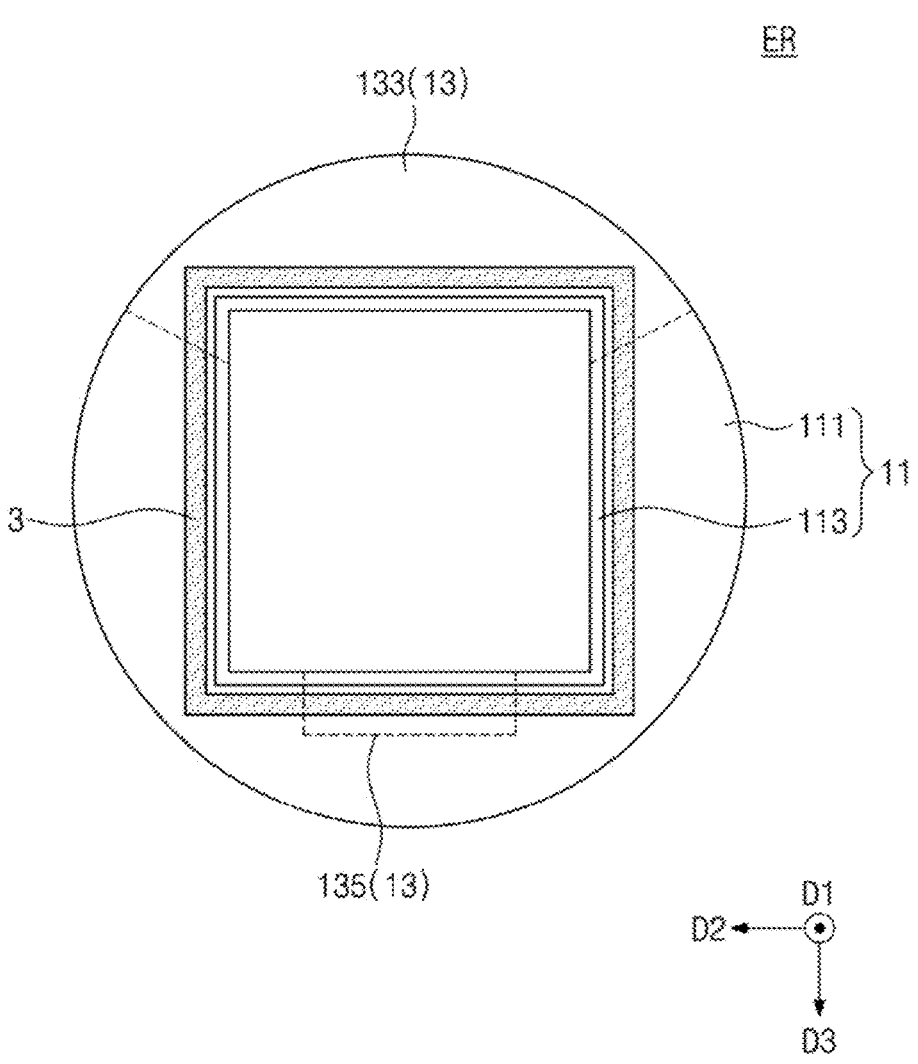
FIG. 3 illustrates a plan view showing a plasma edge ring and a plasma electrode according to some example embodiments of the present inventive concepts.

FIG. 3 illustrates a plan view showing a plasma edge ring and a plasma electrode according to some example embodiments of the present inventive concepts.

Referring to FIG. 3, the guide electrode 3 may have a tetragonal shape when viewed in plan. For example, when viewed in plan, the guide electrode 3 may have a tetragonal shape that surrounds the base member 113. The present inventive concepts, however, are not limited thereto, and the guide electrode 3 may have a circular shape. A detailed description thereof will be further discussed below with reference to FIGS. 15 and 16.

Figure 4:
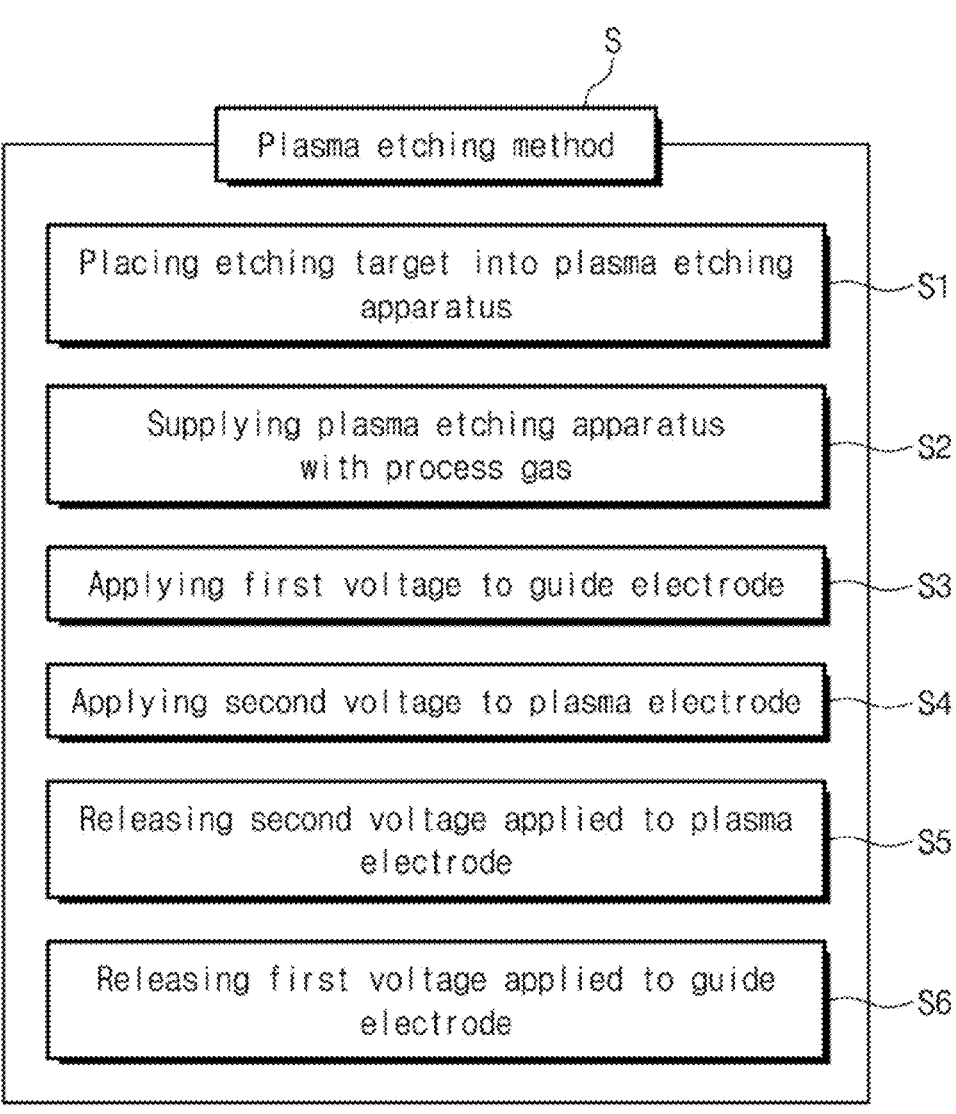
FIG. 4 illustrates a flow chart showing a plasma etching method according to some example embodiments of the present inventive concepts.

FIG. 4 illustrates a flow chart showing a plasma etching method according to some example embodiments of the present inventive concepts.

Referring to FIG. 4, a plasma etching method S may be provided. The plasma etching method S may mean a method of etching one surface of the etching target by using the plasma etching apparatus A discussed with reference to FIGS. 1A to 3. The plasma etching method S may include a step S1 of placing an etching target into a plasma etching apparatus, a step S2 of supplying the plasma etching apparatus with a process gas, a step S3 of applying a first voltage to a guide electrode, a step S4 of applying a second voltage to a plasma electrode, a step S5 of releasing the second voltage applied to the plasma electrode, and a step S6 of releasing the first voltage applied to the guide electrode.

With reference to FIGS. 5 to 10, the following will describe in detail the plasma etching process S of FIG. 4.

FIGS. 5, 6, 7, 8, 9, and 10 illustrate diagrams showing a plasma etching method according to the flow chart of FIG. 4.

Figure 5:
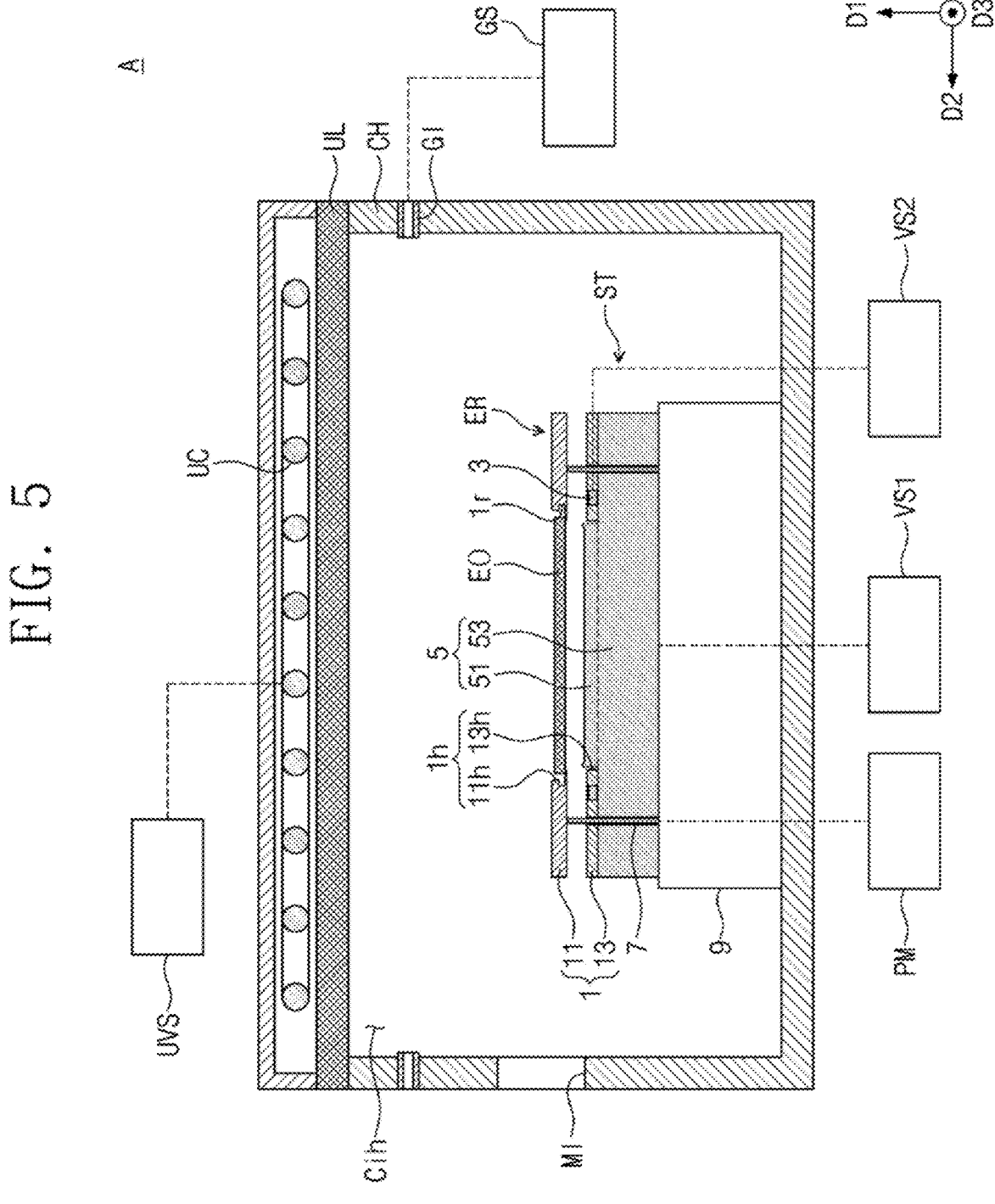
FIGS. 5, 6, 7, 8, 9, and 10 illustrate diagrams showing a plasma etching method according to the flow chart of FIG. 4.
Figure 6:
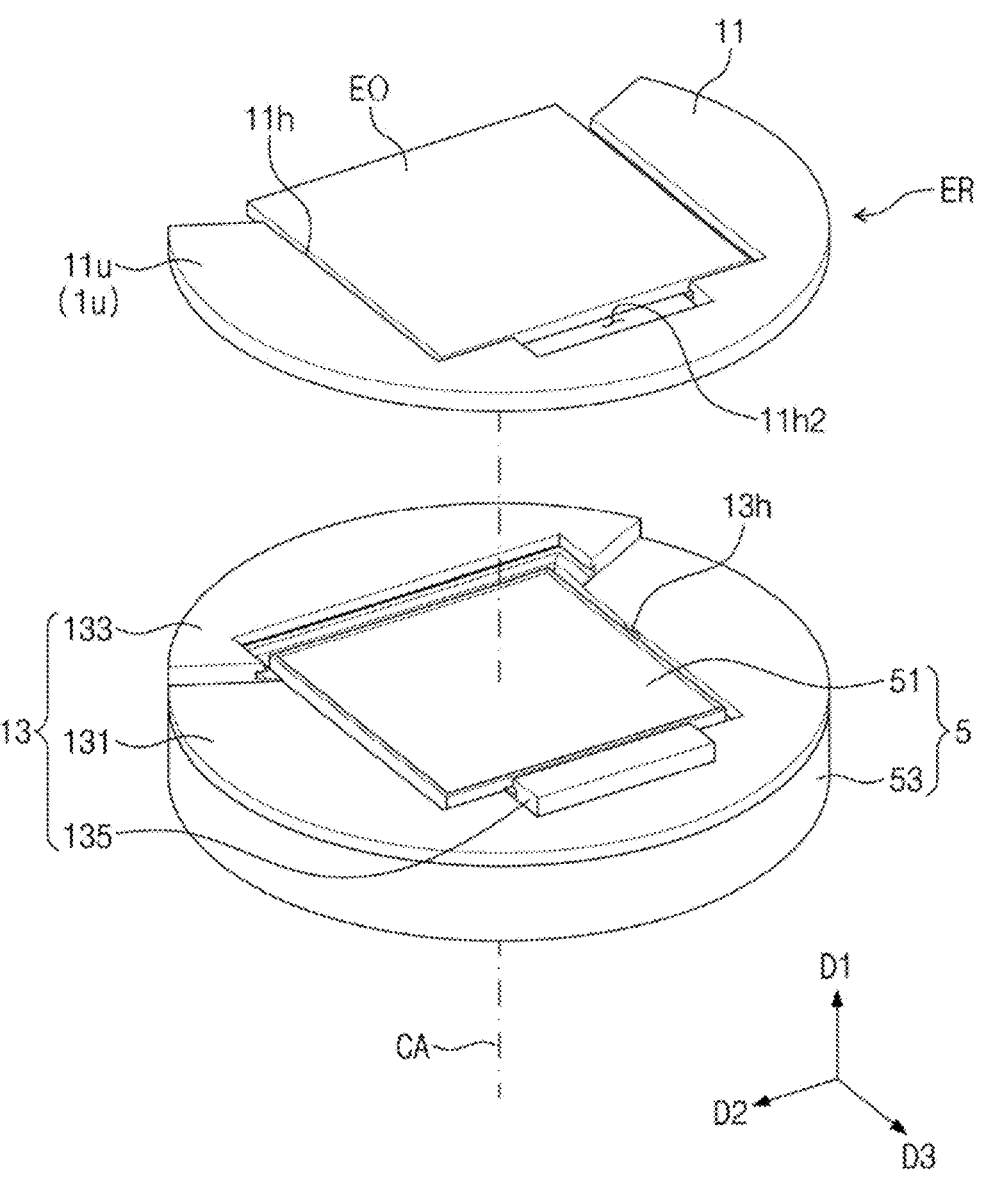

Referring to FIGS. 4, 5, and 6, the etching-target placement step S1 may include placing an etching target EO on the stage ST. For example, the etching target EO, which is introduced by a robot arm into the internal space Cih, may be disposed on the capture ring 11 that is raised by the lift pin 7. For example, the etching target EO may be disposed on the top surface 113*u* of the base member 113 (see FIG. 1B). Afterwards, when the robot arm is pulled out, the lift pin 7 may descend to cause the capture ring 11 to move onto the cover ring 13. Therefore, the etching target EO may be placed on the plasma electrode 5.

Figure 7:
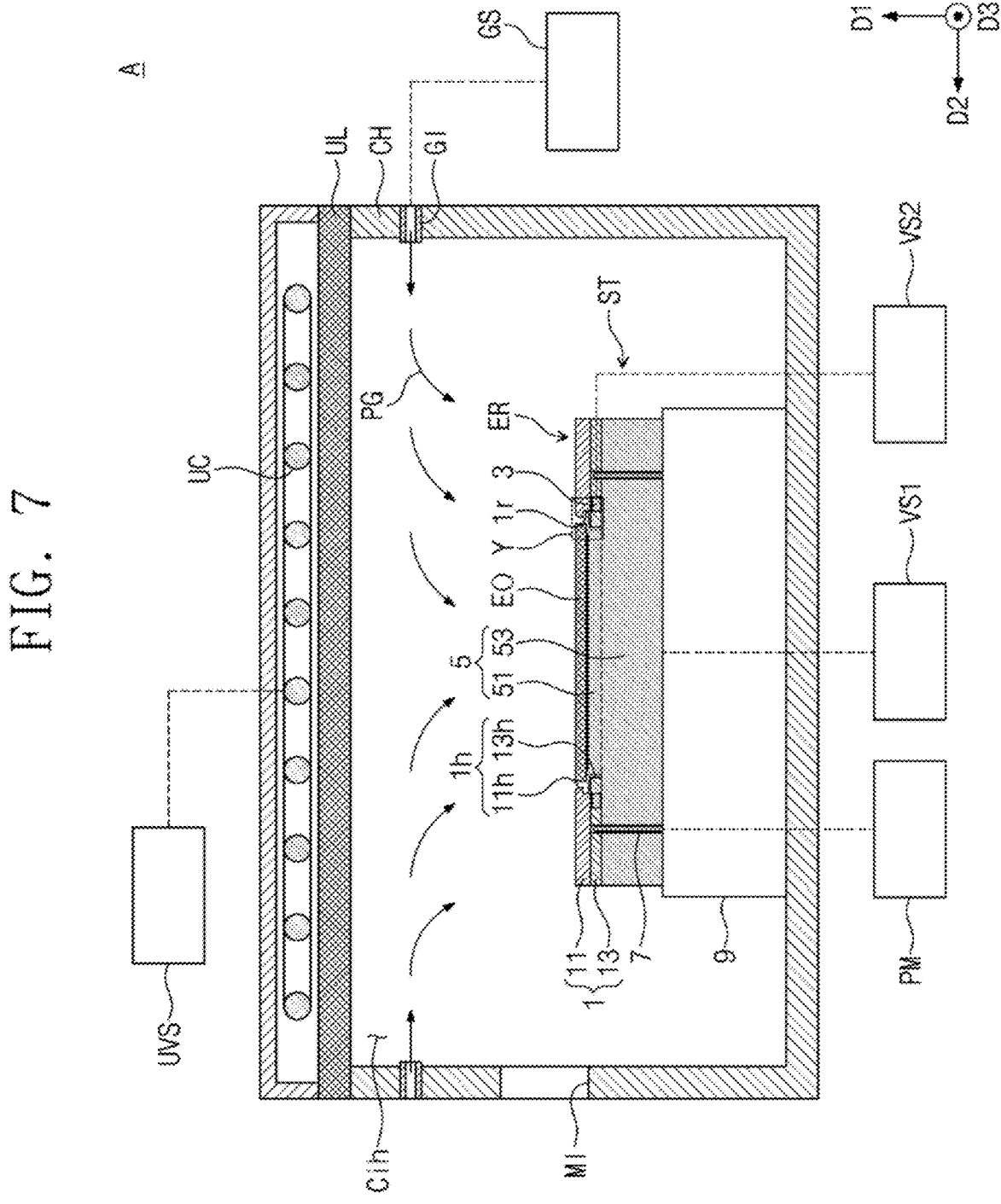
Figure 8:
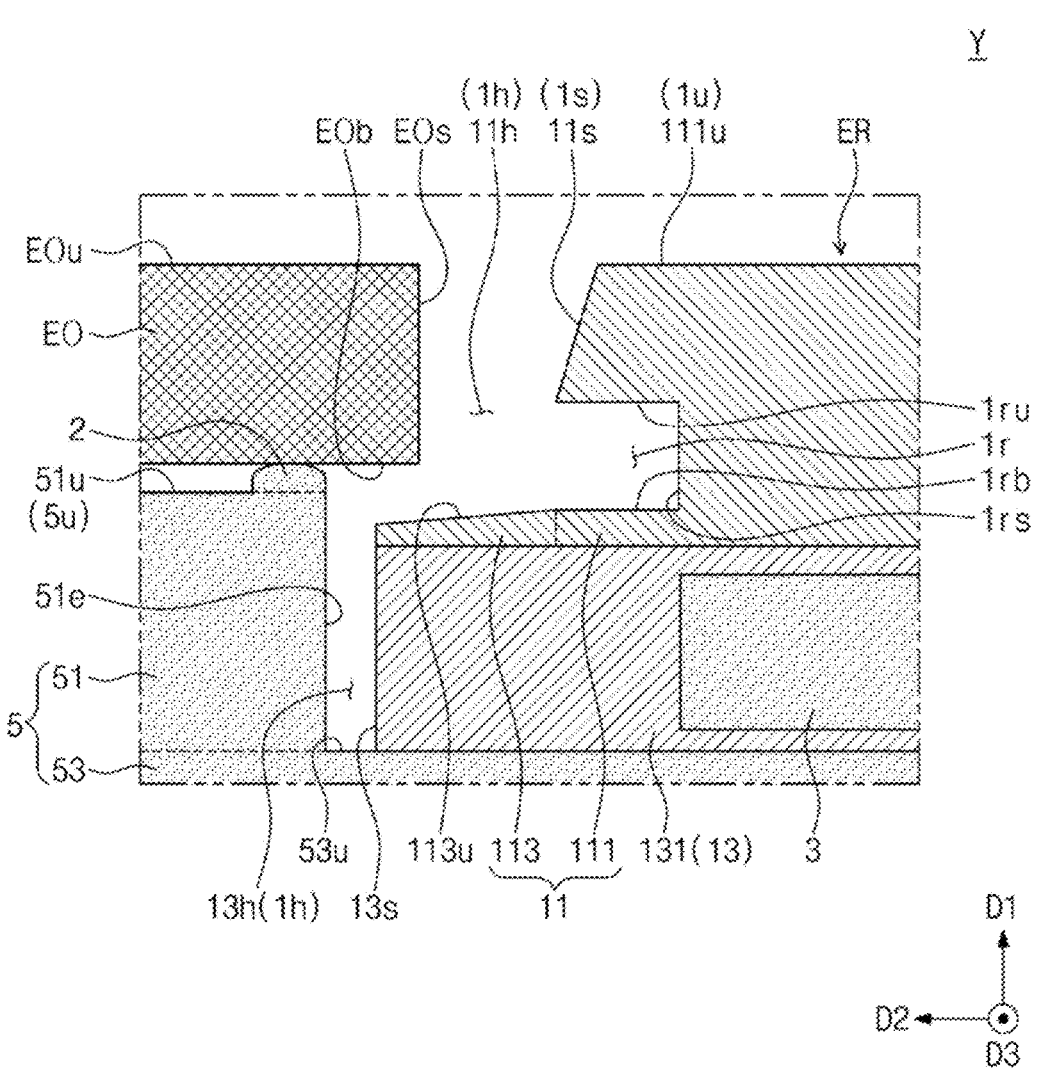

Referring to FIGS. 4, 7, and 8, the process-gas supply step S2 may include allowing the gas supply GS to supply a process gas PG to the internal space Cih. The process gas PG may be provided onto the etching target EO. As illustrated in FIG. 8, the support member 2 may support a bottom surface EOb of the etching target EO. In this case, the bottom surface EOb of the etching target EO may be upwardly spaced apart from the top surface 5*u* of the plasma electrode 5. The etching target EO may have a top surface EOu that is upwardly exposed. In addition, the etching target EO may have an outer lateral surface Eos that is spaced apart from the capture ring 11.

Figure 9:
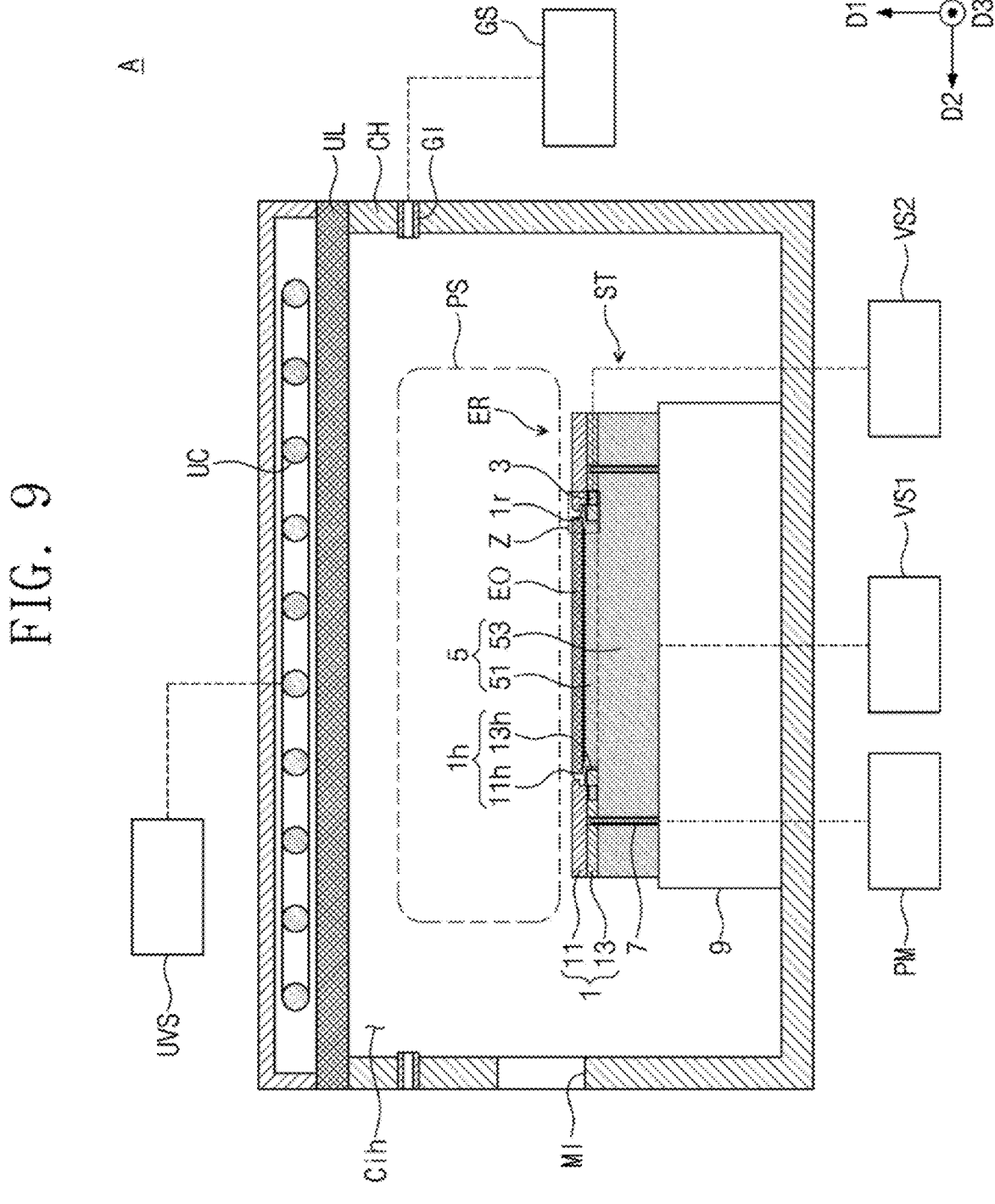

Referring to FIGS. 4 and 9, one or both of the upper electrode UC and the plasma electrode 5 may convert the process gas (see PG of FIG. 7) into plasma PS. For example, a radio-frequency (RF) power applied to the upper electrode UC may generate an electric field and/or a magnetic field in the internal space Cih, and thus the process gas PG may be converted into the plasma PS.

The first-voltage apply step S3 may include allowing the guide voltage supply VS2 to apply a first voltage to the guide electrode 3.

The second-voltage apply step S4 may include allowing the plasma voltage supply VS1 to apply a second voltage to the plasma electrode 5. The second voltage may be applied to the plasma electrode 5 concurrently with the first voltage being applied to the guide electrode 3. In some example embodiments, the second voltage may be less than the first voltage. For example, the first voltage may be greater than the second voltage. The plasma PS on the top surface EOu of the etching target EO may descend toward the etching target EO. For example, the second voltage applied to the plasma electrode 5 may generate an electric field and/or a magnetic field in a space where the plasma PS is present, and thus the plasma PS may be pulled down. Therefore, the etching target EO may be etched with particles of the plasma PS.

Figure 10:
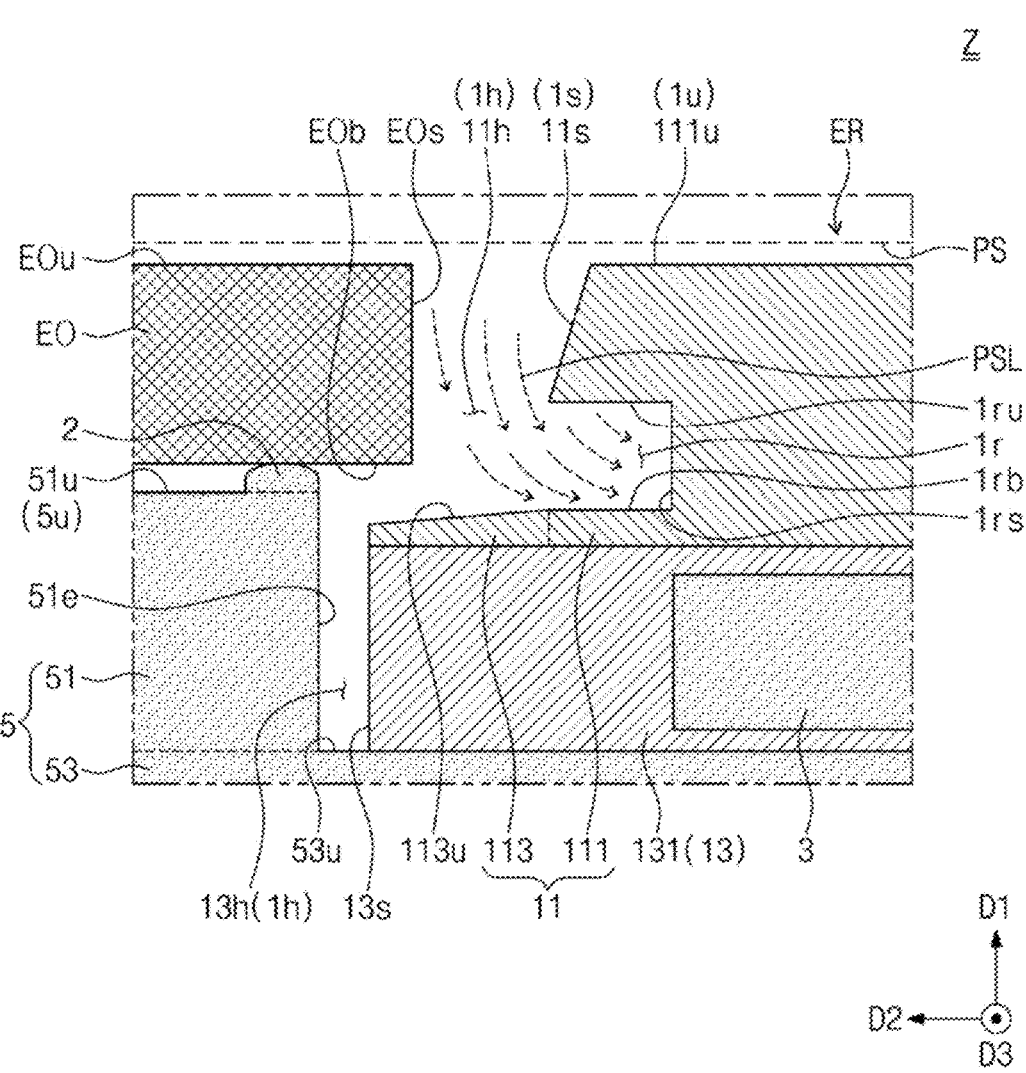

Referring to FIG. 10, in a procedure where the particles of the plasma PS move toward the etching target EO, portions PSL of the particles of the plasma PS may move downwardly from outside the outer lateral surface EOs of the etching target EO. An electric field and/or a magnetic field formed by the guide electrode 3 may allow the recess 1*r* to receive the portions PSL of the particles of the plasma PS that moves downwardly from outside the outer lateral surface Eos of the etching target EO. When the first voltage is greater than the second voltage, the portions PSL of the particles of the plasma PS may be reduced or prevented from moving toward the plateau 51. For example, because the guide electrode 3 creates a stronger force, the portions PSL of the particles of the plasma PS, which migrates downwardly from outside the outer lateral surface Eos of the etching target EO, may move not toward the plateau 51 but toward the guide electrode 3. The portions PSL of the particles of the plasma PS pulled toward the guide electrode 3 may be gathered into the recess 1*r*. Thereafter, the portions PSL of the particles of the plasma PS may be reduced or prevented from moving toward the bottom surface EOb of the etching target EO.

In some example embodiments, the first-voltage apply step S3 may be performed followed by the second-voltage apply step S4. For example, before the plasma electrode 5 drives the particles of the plasma PS to start moving toward the etching target EO, a flow guide of the particles of the plasma PS may be performed by the guide electrode 3. Therefore, in a procedure where the particles of the plasma PS are migrated by the plasma electrode 5, the particles of the plasma PS may be reduced or prevented from moving toward the bottom surface EOb of the etching target EO.

Referring back to FIG. 4, the second-voltage release step S5 may include interrupting the supply of the RF power that the plasma voltage supply VS1 transmits to the plasma electrode 5. Therefore, it may be possible to stop the movement of the particles of the plasma PS toward the etching target EO.

The first-voltage release step S6 may include interrupting the supply of the RF power that the guide voltage supply VS2 transmits to the guide electrode 3. The first-voltage release step S6, which may include releasing the first voltage applied to the guide electrode 3, may be performed subsequently to performing the second voltage release step S5, which may include releasing the second voltage applied to the plasma electrode 5.

In some example embodiments, the second-voltage release step S5 may be performed followed by the first-voltage release step S6. Therefore, a flow control by the guide electrode 3 may continue for a longer time. Accordingly, the particles of the plasma PS may be reduced or prevented from moving, by the plasma electrode 5, toward the bottom surface EOb of the etching target EO.

According to a plasma edge ring, a plasma etching apparatus including the same, and a plasma etching method using the same in accordance with some example embodiments of the present inventive concepts, a guide electrode may induce an outward movement of plasma ion particles which are intended to move toward a bottom surface of an etching target. When a voltage applied to the guide electrode is greater than that applied to a plasma electrode, the plasma ion particles may be effectively reduced or prevented from moving toward the bottom surface of the etching target. Therefore, even when the bottom surface of the etching target is exposed, the bottom surface of the etching target may have reduced etching or may be prevented from being etched with the plasma ion particles. In addition, a voltage may be applied earlier to the guide electrode than to the plasma electrode and released later from the guide electrode than from the plasma electrode, and thus at an earlier or later time of process, the plasma ion particles may be at least partially mitigated or completely prevented from moving toward the bottom surface of the etching target. Therefore, the etching target may be prevented from being undesirably etched on the bottom surface thereof, or such undesirable etching may be at least reduced. As a result, the average quality of the resultant etched etching target may be improved as a result of the reduction or prevention of undesirable etching, which may be improve the quality, reliability, and/or performance of a resultant device manufactured to include at least a portion of the etched etching target (e.g., the reduction or prevention of undesirable etching of the etching target may reduce the likelihood of electrical shorts in a device having conductive lines, layers, or the like and/or insulating lines, layers or the like that are at least partly based on the structure of the etched etching target; reduction or prevention of structural failure of the etching target during a later manufacturing operation that processes the etching target or incorporates the etching target into a manufactured electronic device; reduction or prevention of structural failure of at least a portion of an electronic device that includes at least a portion of the etched etching target; any combination thereof, or the like). Accordingly, it may be possible to control the quality of the bottom surface of the etching target. When the etching target is a photomask, it may be possible to control the quality of a bottom surface of the photomask. In conclusion, a yield may be increased when testing quality of top and bottom surfaces of the photomask before an exposure process.

According to a plasma edge ring, a plasma etching apparatus including the same, and a plasma etching method using the same in accordance with some example embodiments of the present inventive concepts, a recess may be used to gather the plasma ion particles. For example, the recess may provide a parking space for the plasma ion particles that are outwardly guided by the guide electrode, and thus the plasma ion particles may be reduced or prevented from moving toward the bottom surface of the etching target.

For convenience of description, the following will omit an explanation of features substantially the same as or similar to those discussed with reference to FIGS. 1 to 10.

Figure 11:
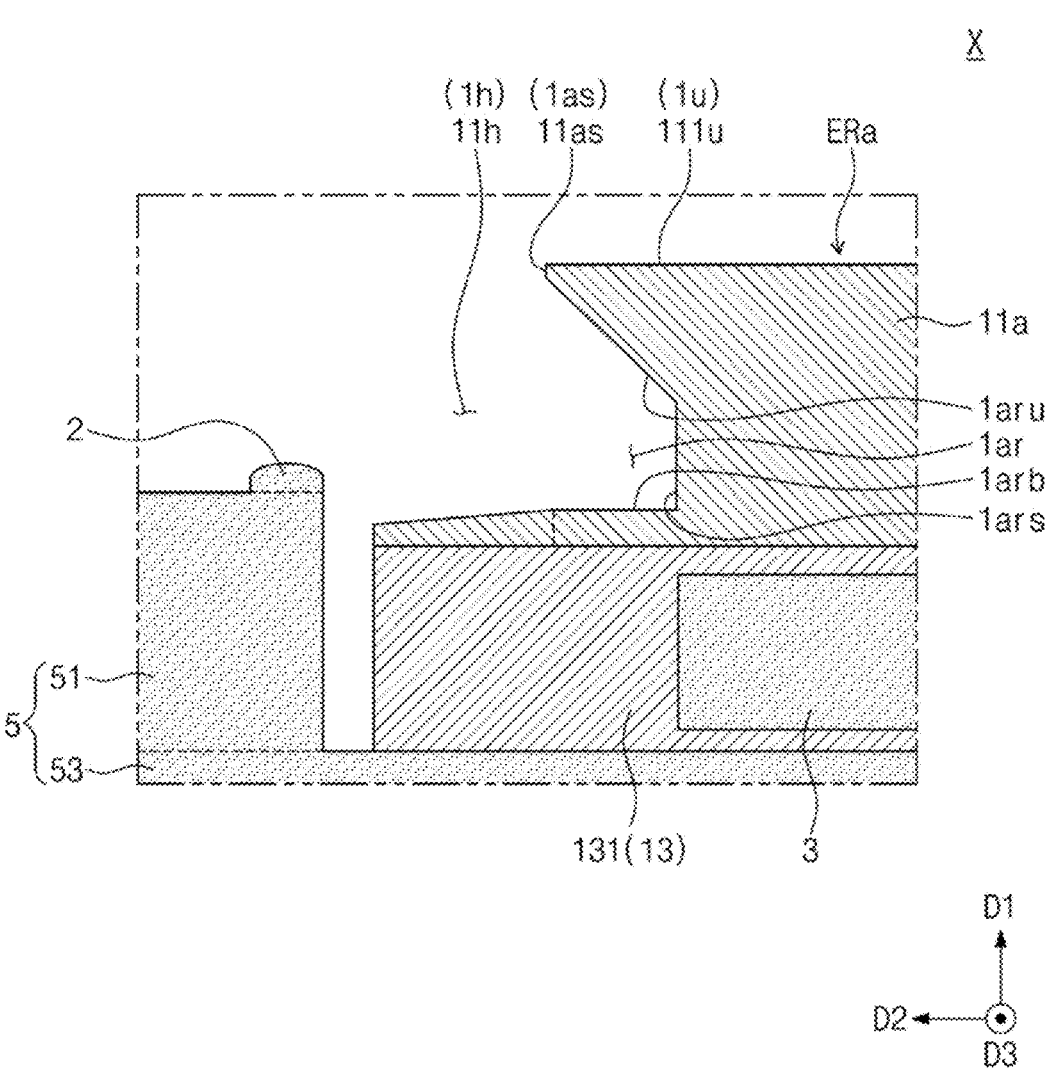
FIG. 11 illustrates an enlarged cross-sectional view partially showing a plasma etching apparatus according to some example embodiments of the present inventive concepts.

FIG. 11 illustrates an enlarged cross-sectional view (e.g., an enlarged cross-sectional view showing section X of FIG. 1A) partially showing a plasma etching apparatus according to some example embodiments of the present inventive concepts.

Referring to FIG. 11, a plasma edge ring ERa may include a capture ring 11a. The capture ring 11a may provide a recess 1ar whose shape is different from that discussed with reference to FIG. 1B. For example, a recess top surface 1am may be inclined. For more detail, the recess top surface 1aru may be located at a level that slopes downwardly and outwardly (e.g., outwardly away from the center C of the plasma edge ring Era and/or of the plate body 1, which may be represented by the center C shown in FIG. 1A). Therefore, plasma ion particles may be guided by and move along the recess top surface 1aru toward the guide electrode 3. A recess lateral surface 1ars and a recess bottom surface 1arb may be similar to those shown in FIG. 1B.

Figure 12:
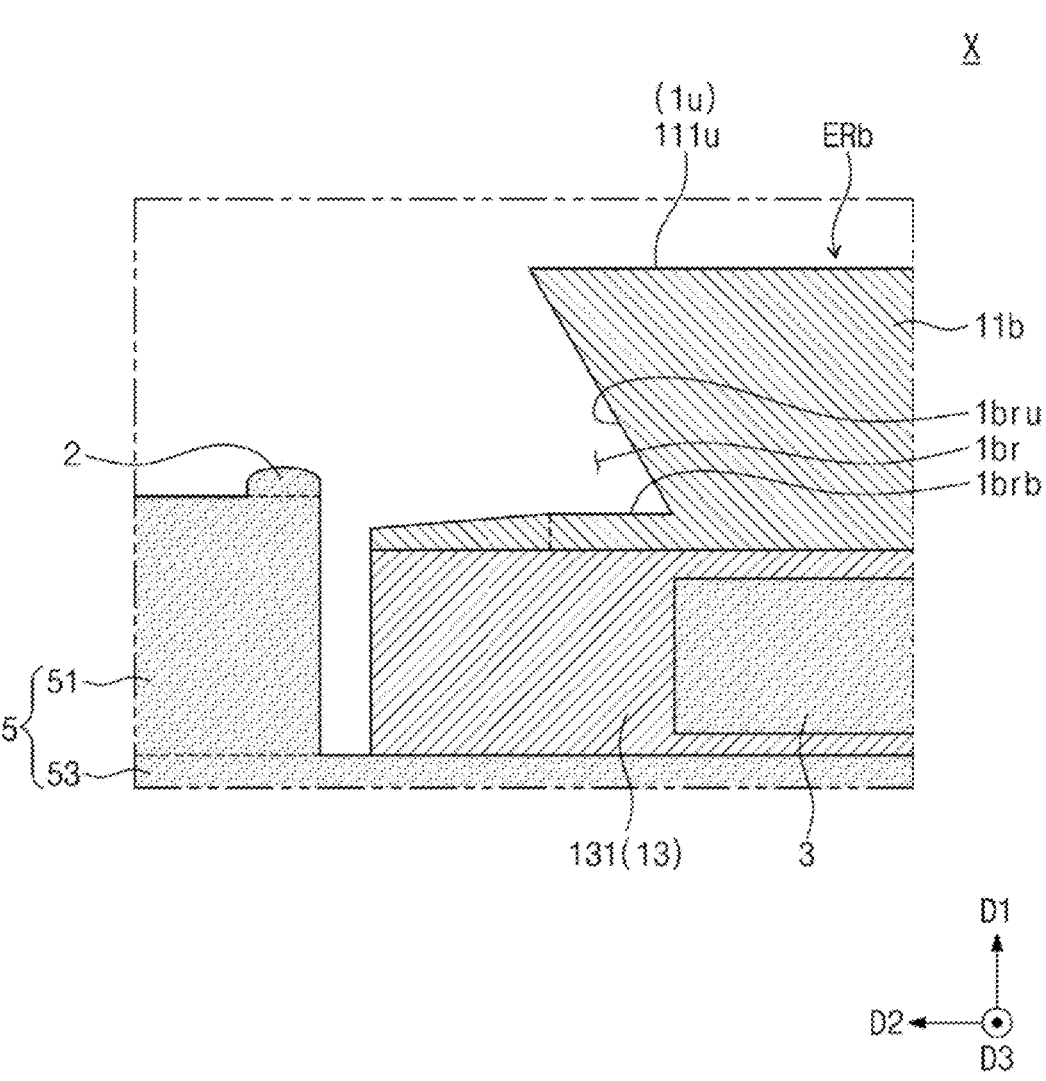
FIG. 12 illustrates an enlarged cross-sectional view partially showing a plasma etching apparatus according to some example embodiments of the present inventive concepts.

FIG. 12 illustrates an enlarged cross-sectional view (e.g., an enlarged cross-sectional view showing section X of FIG. 1A) partially showing a plasma etching apparatus according to some example embodiments of the present inventive concepts.

Referring to FIG. 12, a plasma edge ring ERb may include a capture ring 11b. The capture ring 11b may provide a recess 1br whose shape is different from that discussed with reference to FIG. 1B. For example, a recess top surface 1bru may be connected to a top surface 1u of the plasma edge ring ERb. In this case, no recess lateral surface may be present, and the capture ring 11b may have no inner lateral surface positioned on the recess 1br. A recess bottom surface 1brb may be similar to that shown in FIG. 1B.

Figure 13:
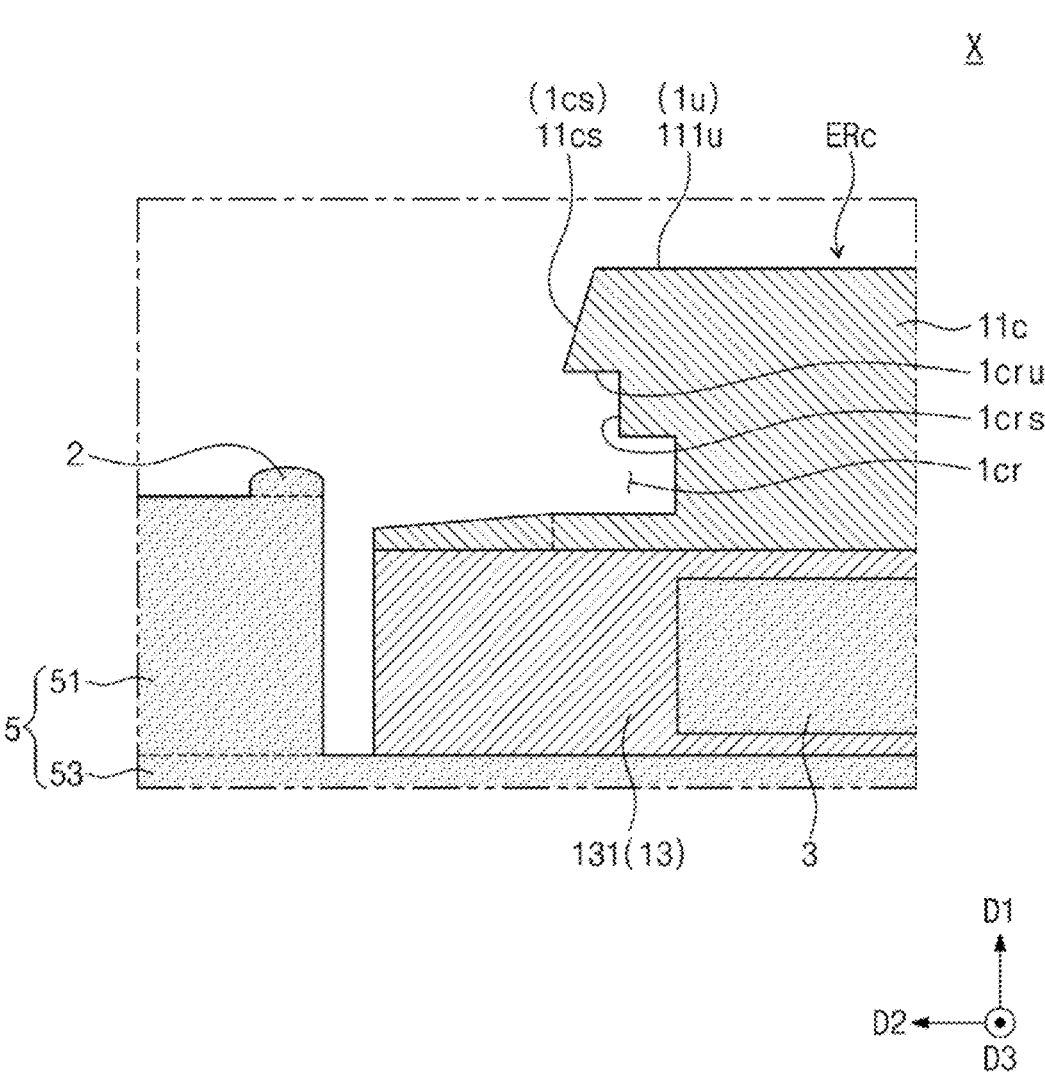
FIG. 13 illustrates an enlarged cross-sectional view partially showing a plasma etching apparatus according to some example embodiments of the present inventive concepts.

FIG. 13 illustrates an enlarged cross-sectional view (e.g., an enlarged cross-sectional view showing section X of FIG. 1A) partially showing a plasma etching apparatus according to some example embodiments of the present inventive concepts.

Referring to FIG. 13, a plasma edge ring ERc may include a capture ring 11c. The capture ring 11c may provide a recess 1cr whose shape is different from that discussed with reference to FIG. 1B. For example, a recess top surface 1cru and a recess lateral surface 1crs may constitute a stepwise structure. FIG. 13 depicts a two-step structure, but the present inventive concepts are not limited thereto. For example, the step structure may have three or more steps.

Figure 14:
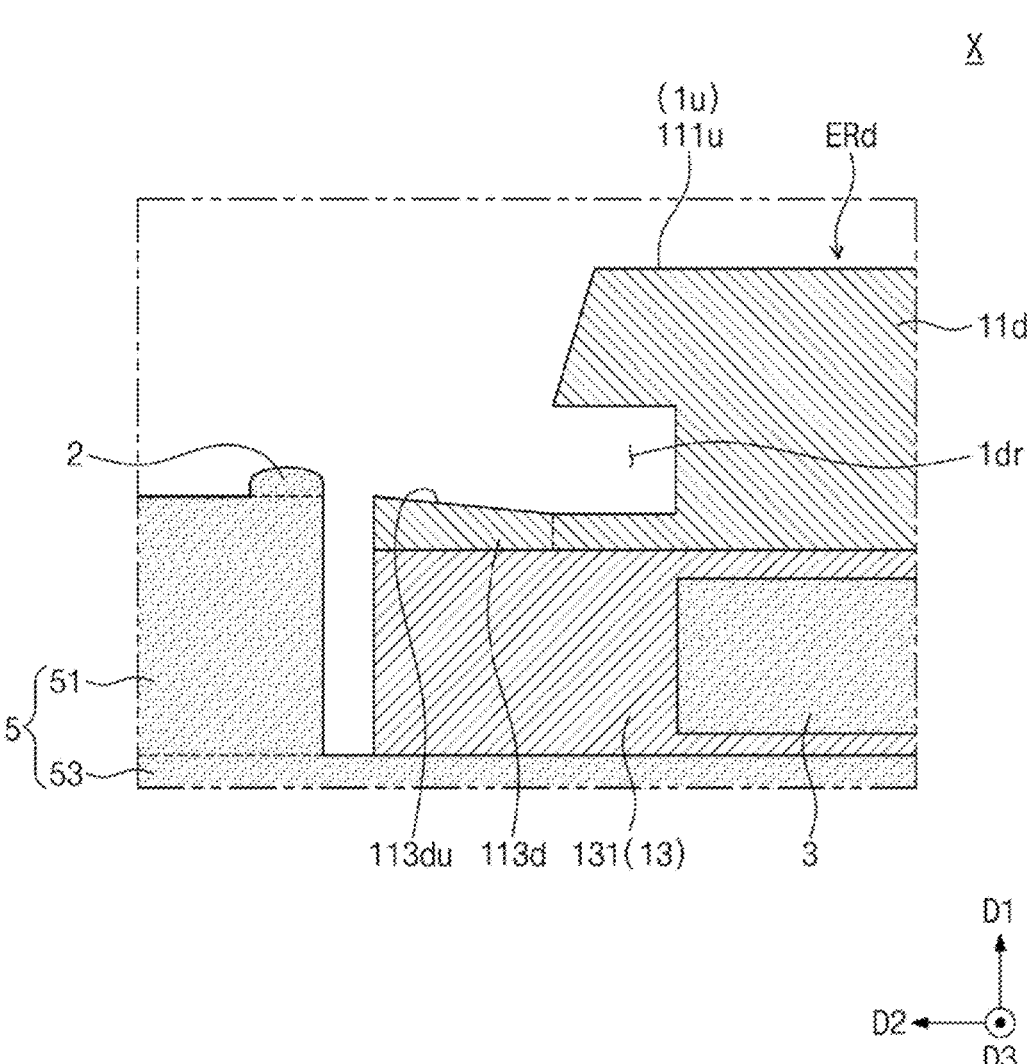
FIG. 14 illustrates an enlarged cross-sectional view partially showing a plasma etching apparatus according to some example embodiments of the present inventive concepts.

FIG. 14 illustrates an enlarged cross-sectional view (e.g., an enlarged cross-sectional view showing section X of FIG. 1A) partially showing a plasma etching apparatus according to some example embodiments of the present inventive concepts.

Referring to FIG. 14, a plasma edge ring ERd may include a capture ring 11d. A base member 113d may be different from that discussed with reference to FIG. 1B. For example, the base member 113d may have a top surface 113du at a level that slopes upwardly and inwardly. In this case, plasma ion particles gathered in a recess 1dr may be effectively reduced or prevented from moving inwardly toward the plateau 51.

Figure 15:
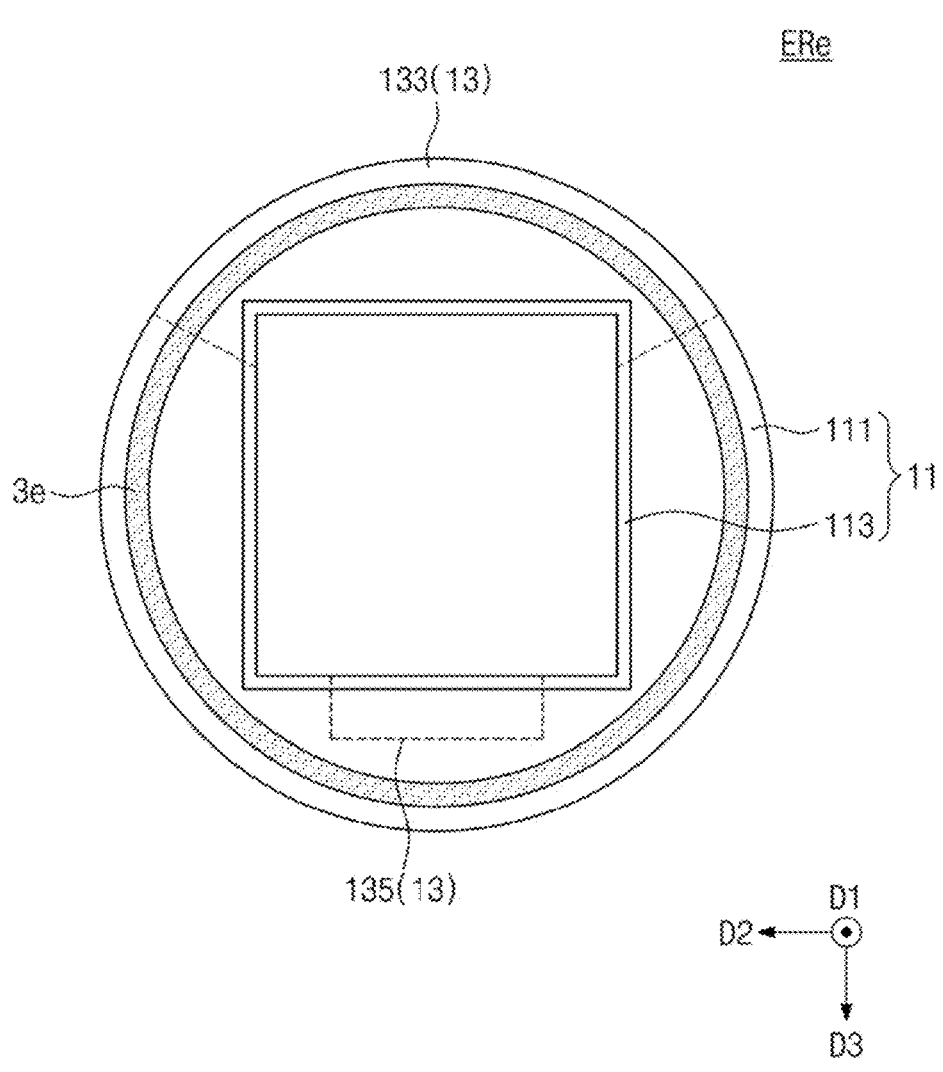
FIG. 15 illustrates a plan view showing a plasma edge ring and a plasma electrode according to some example embodiments of the present inventive concepts.

FIG. 15 illustrates a plan view showing a plasma edge ring and a plasma electrode according to some example embodiments of the present inventive concepts.

Referring to FIG. 15, a guide electrode 3e in a plasma edge ring Ere may have a circular shape. The circular guide electrode 3e may surround the base member 113.

Figure 16:
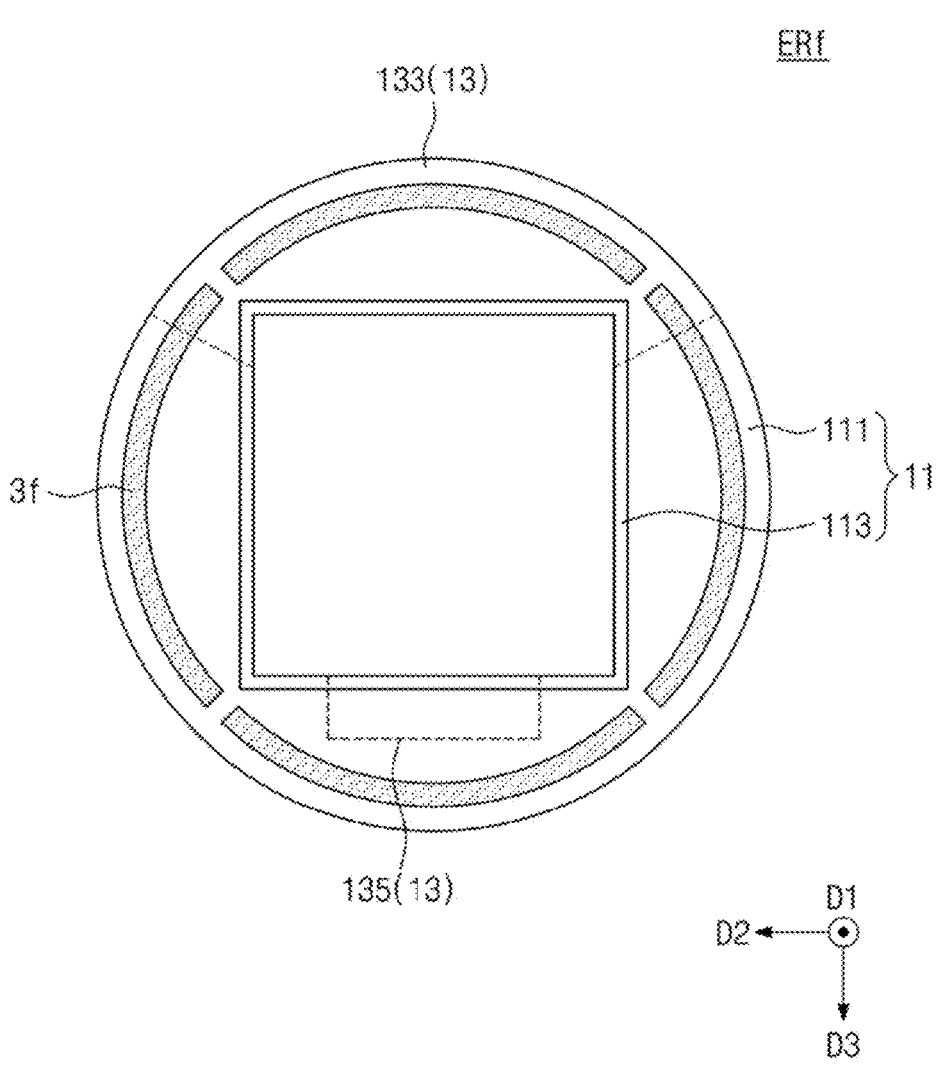
FIG. 16 illustrates a plan view showing a plasma edge ring and a plasma electrode according to some example embodiments of the present inventive concepts.

FIG. 16 illustrates a plan view showing a plasma edge ring and a plasma electrode according to some example embodiments of the present inventive concepts.

Referring to FIG. 16, a guide electrode 3f in a plasma edge ring ERf may have a circular shape as a whole. However, differently from that shown in FIG. 15, the guide electrode 3f may include a plurality of pieces that are divided along a circumferential direction. For example, as shown in FIG. 16, the guide electrode 3f may include four pieces that are divided along a circumferential direction. The guide electrode 3f, which are divided into a plurality of pieces, may be possible to independently control an electric field for each region. Therefore, it may be possible to precisely control the electric field.

Figure 17:
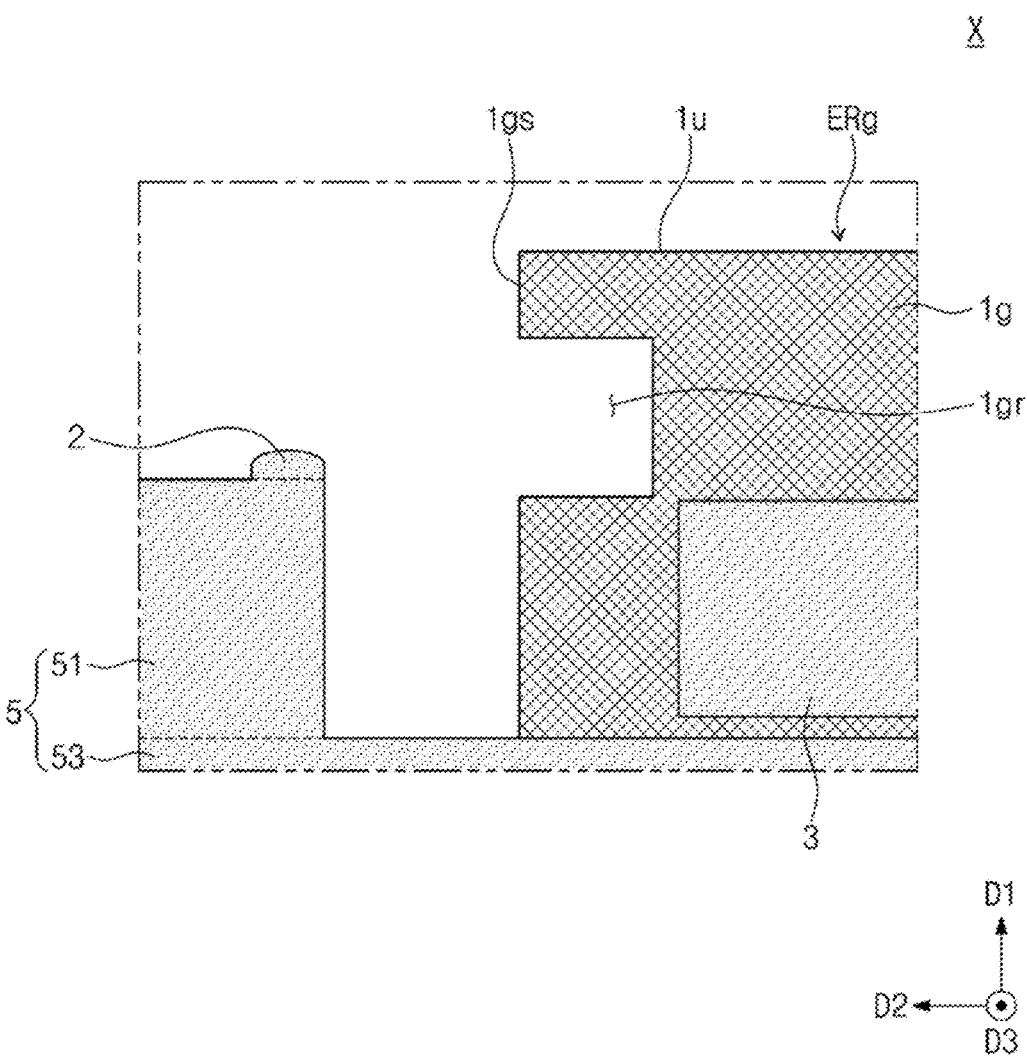
FIG. 17 illustrates an enlarged cross-sectional view partially showing a plasma etching apparatus according to some example embodiments of the present inventive concepts.

FIG. 17 illustrates an enlarged cross-sectional view (e.g., an enlarged cross-sectional view showing section X of FIG. 1A) partially showing a plasma etching apparatus according to some example embodiments of the present inventive concepts.

Referring to FIG. 17, a plasma edge ring ERg may not be divided into a capture ring and a cover ring. For example, the plasma edge ring Erg may be formed of a single plate body 1g. The plate body 1g may provide a recess 1gr. The plate body 1g may have an inner lateral surface 1gs whose portion is outwardly recessed to form the recess 1gr. A certain component other than the plasma edge ring ERg may drive an etching target to move upwardly and downwardly. For example, the etching target may ascend and descend while being in contact with a lift pin.

Figure 18:
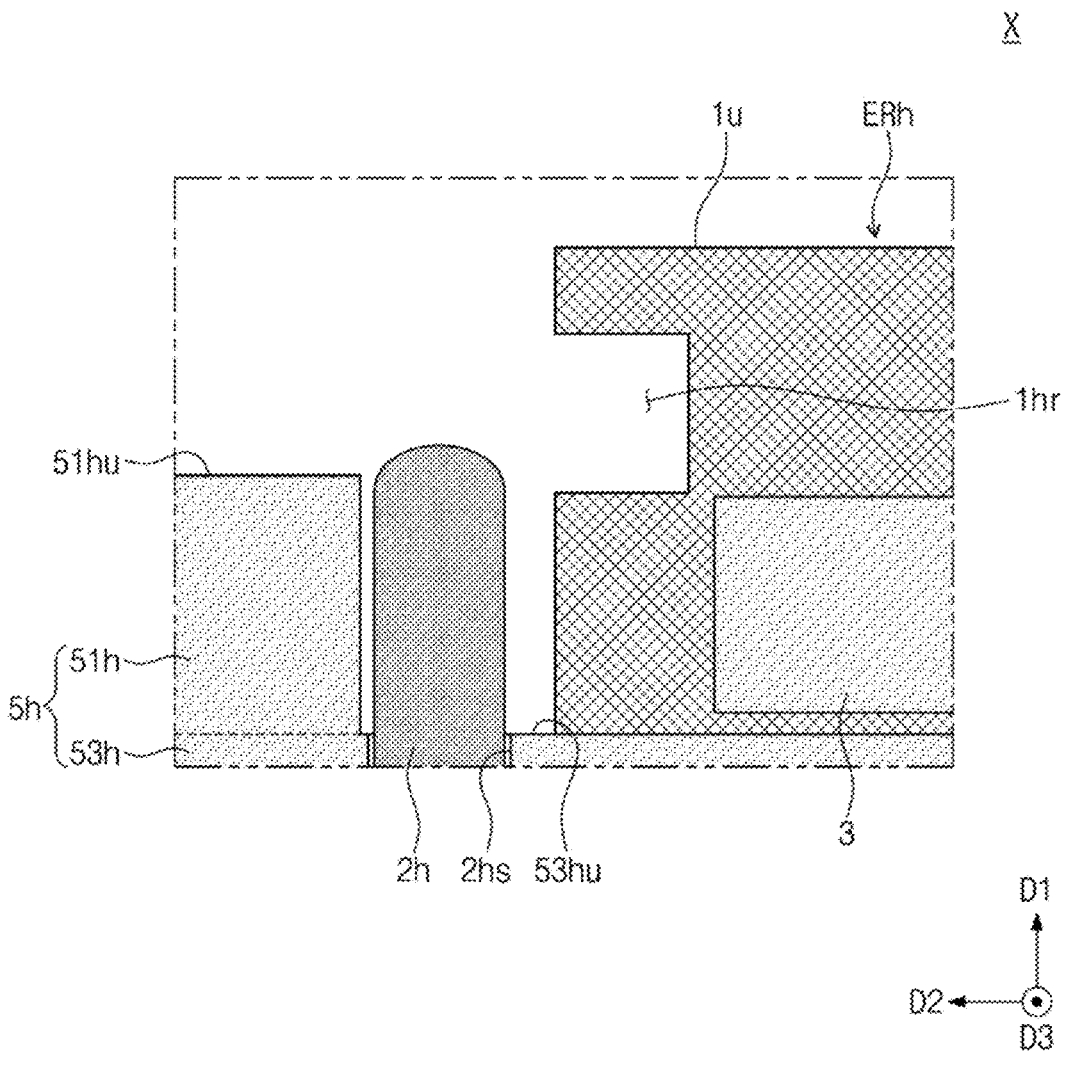
FIG. 18 illustrates an enlarged cross-sectional view partially showing a plasma etching apparatus according to some example embodiments of the present inventive concepts.

FIG. 18 illustrates an enlarged cross-sectional view (e.g., an enlarged cross-sectional view showing section X of FIG. 1A) partially showing a plasma etching apparatus according to some example embodiments of the present inventive concepts.

Referring to FIG. 18, a plasma edge ring ERh may not be divided into a capture ring and a cover ring. For example, the plasma edge ring ERh may provide a recess 1hr. In addition, a support member 2h may be positioned outside a plateau 51h. For example, the support member 2h may be provided separately from a plasma electrode 5h. The support member 2h may be inserted into a support member insertion hole 2hs formed in an electrode body 53h. The support member 2h may have a top surface at a higher level than that of a top surface 51hu of the plateau 51h. The support member 2h may also serve as the lift pin (see 7 of FIG. 1A) discussed with reference to FIG. 1A.

Figure 19:
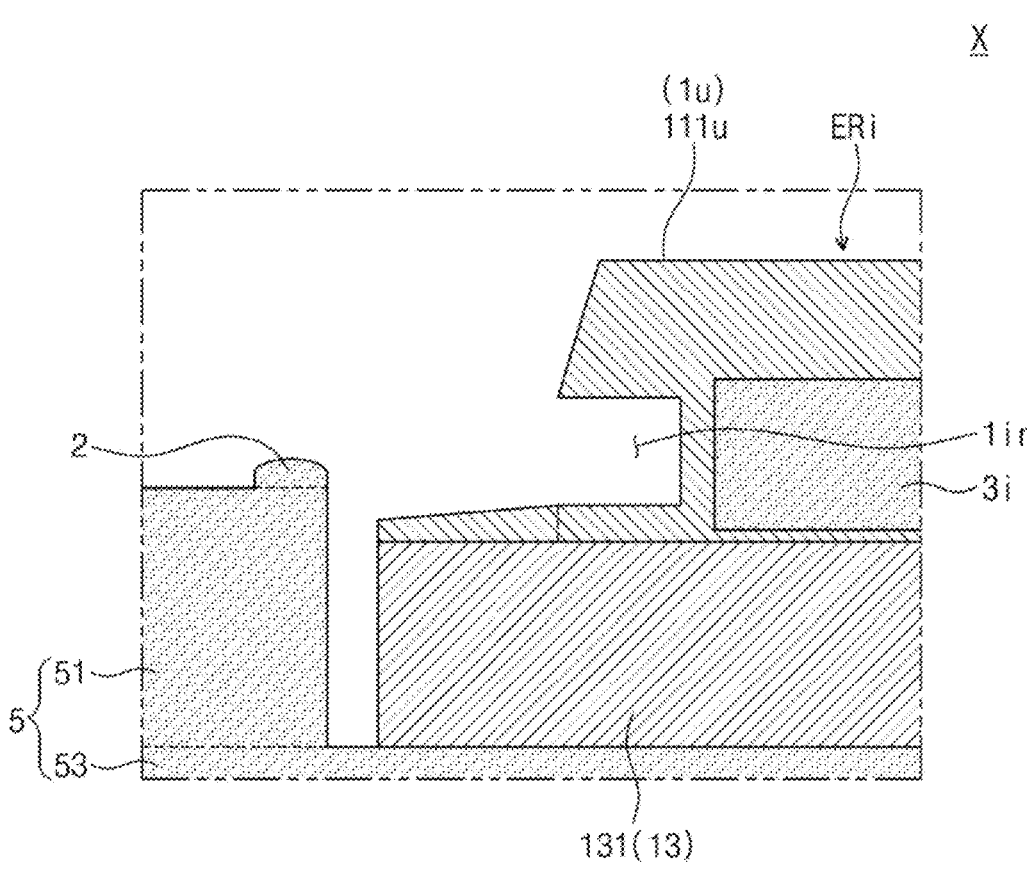
FIG. 19 illustrates an enlarged cross-sectional view partially showing a plasma etching apparatus according to some example embodiments of the present inventive concepts.

FIG. 19 illustrates an enlarged cross-sectional view (e.g., an enlarged cross-sectional view showing section X of FIG. 1A) partially showing a plasma etching apparatus according to some example embodiments of the present inventive concepts.

Referring to FIG. 19, a plasma edge ring ERi may be similar to that discussed with reference to FIG. 1B. However, a guide electrode 3i may be located at a different position from that of the guide electrode 3 shown in FIG. 1B. For example, the guide electrode 3i may be positioned outside a recess 1ir. When viewed in plan, the guide electrode 3i may not overlap the recess 1ir.

Figure 20:
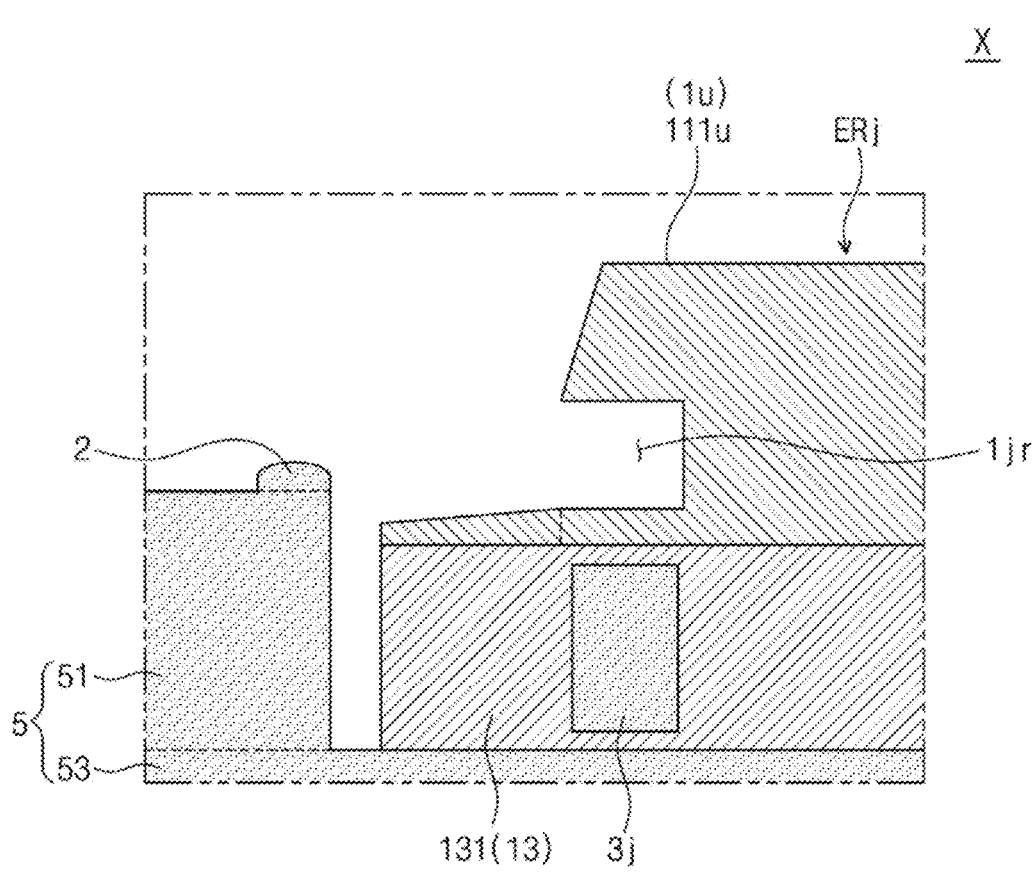
FIG. 20 illustrates an enlarged cross-sectional view partially showing a plasma etching apparatus according to some example embodiments of the present inventive concepts.

FIG. 20 illustrates an enlarged cross-sectional view (e.g., an enlarged cross-sectional view showing section X of FIG. 1A) partially showing a plasma etching apparatus according to some example embodiments of the present inventive concepts.

Referring to FIG. 20, a plasma edge ring ERj may be similar to that discussed with reference to FIG. 1B. However, a guide electrode 3j may be located at a different position from that of the guide electrode 3 shown in FIG. 1B. For example, the guide electrode 3j may be positioned beneath a recess 1jr. When viewed in plan, the guide electrode 3j may overlap the recess 1jr. For example, when viewed in plan, the guide electrode 3j may not be exposed outside the recess 1jr.

Figure 21:
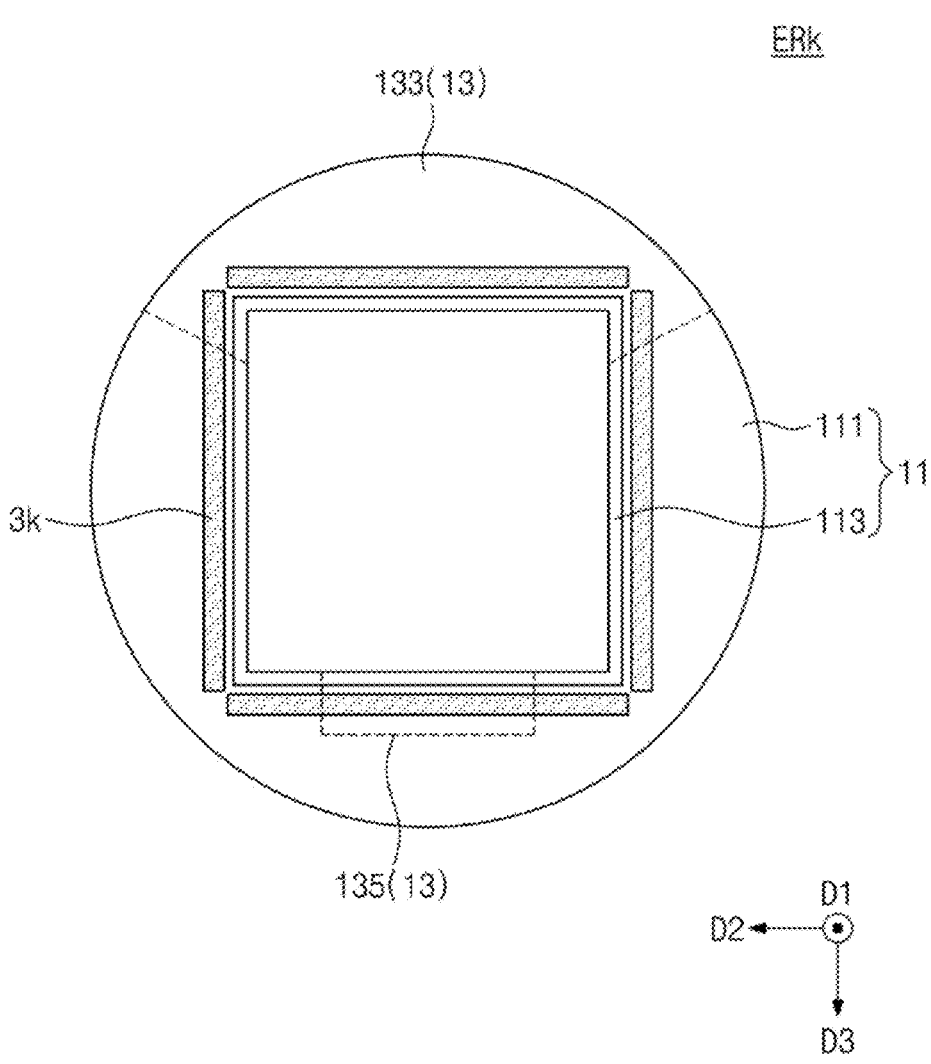
FIG. 21 illustrates a plan view showing a plasma edge ring and a plasma electrode according to some example embodiments of the present inventive concepts.

FIG. 21 illustrates a plan view showing a plasma edge ring and a plasma electrode according to some example embodiments of the present inventive concepts.

Referring to FIG. 21, a guide electrode 3k in a plasma edge ring ERk may have a tetragonal shape when viewed in plan. Different from that shown in FIG. 3, the guide electrode 3k may be provided in plural. For example, the guide electrode 3k may be divided into four pieces as shown in FIG. 21. The guide electrode 3k, which is divided into a plurality of pieces, may be possible to independently control an electric field for each region. For example, an independent control of the electric field may be possible for each side of the tetragonal shape. Therefore, it may be possible to precisely control the electric field.

According to a plasma edge ring, a plasma etching apparatus including the same, and a plasma etching method using the same in accordance with the present inventive concepts, it may be possible to reduce an etching on a bottom surface of a mask.

According to a plasma edge ring, a plasma etching apparatus including the same, and a plasma etching method using the same in accordance with the present inventive concepts, it may be possible to control an ion flow.

According to a plasma edge ring, a plasma etching apparatus including the same, and a plasma etching method using the same in accordance with the present inventive concepts, it may be possible to increase a manufacturing yield.

Effects of the present inventive concepts are not limited to the mentioned above, other effects which have not been mentioned above will be clearly understood to those skilled in the art from the following description.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A plasma etching apparatus, comprising:
a plasma electrode configured to support an etching target and generate a plasma above the etching target;
a plasma edge ring on the plasma electrode;
a guide electrode outside the etching target on the plasma electrode;
a guide voltage supply connected to the guide electrode; and
a plasma etching apparatus control device operably connected to the guide voltage supply,
wherein the plasma edge ring includes an inner sidewall surface including
a first surface portion that at least partially defines a placement hole that vertically penetrates a center of the plasma edge ring, and
a second surface portion that at least partially defines a recess that is recessed away from the center of the plasma edge ring in relation to the first surface portion of the inner sidewall surface,
wherein the guide electrode is outside or beneath the recess, and
wherein the plasma etching apparatus control device is configured to operably control the guide voltage supply to cause the guide electrode to generate a magnetic field and/or an electric field to cause particles generated by the plasma to be guided away from the etching target towards the guide electrode and into the recess, such that the recess receives the particles generated by the plasma.

2. The plasma etching apparatus of claim 1, wherein the guide electrode is within the plasma edge ring.

3. The plasma etching apparatus of claim 1, wherein the plasma electrode includes:
an electrode body; and
a plateau on the electrode body,
wherein the plateau is in the placement hole, and
wherein the plasma edge ring surrounds the plateau.

4. The plasma etching apparatus of claim 1, wherein the recess is beneath a top surface of the plasma edge ring and is isolated from exposure to an exterior of the plasma edge ring in a vertical direction by the top surface of the plasma edge ring.

5. The plasma etching apparatus of claim 1, wherein, in a plan view, the placement hole has a tetragonal shape.

6. A plasma etching apparatus, comprising:
a plasma electrode configured to generate a plasma;
a support member on a top surface of the plasma electrode configured to support an etching target;
a plasma edge ring that surrounds the support member;
a guide electrode;
a plasma voltage supply that is configured to apply a first voltage to the plasma electrode;
a guide voltage supply that is configured to apply a second voltage to the guide electrode; and
a plasma etching apparatus control device operably connected to the guide voltage supply,
wherein the guide electrode is outside the support member, and
wherein the plasma edge ring includes an inner sidewall surface including a first surface portion that at least partially defines a placement hole that vertically penetrates a center of the plasma edge ring; and a second surface portion that at least partially defines a recess that is recessed away from the center of the plasma edge ring in relation to the first surface portion of the inner sidewall surface, wherein the second surface portion includes a recess bottom surface that at least partially defines the recess and is at a level lower than a level of the support member, and wherein the plasma etching apparatus control device is configured to operably control the guide voltage supply to cause the guide electrode to generate a magnetic field and/or an electric field to cause particles generated by the plasma to be guided away from the etching target towards the guide electrode and into the recess, such that the recess receives the particles generated by the plasma.

7. The plasma etching apparatus of claim 6, wherein the plasma electrode includes:

an electrode body; and a plateau on the electrode body, wherein the plateau is in the placement hole, wherein the plasma edge ring surrounds the plateau, and wherein the support member is on a top surface of the plateau.

8. The plasma etching apparatus of claim 6, wherein the plasma edge ring includes one or more inner surfaces that at least partially define a guide electrode insertion hole, and the guide electrode is in the guide electrode insertion hole.

9. The plasma etching apparatus of claim 6, wherein the guide electrode is outside or beneath the recess.

10. The plasma etching apparatus of claim 9, wherein the recess is covered with a top surface of the plasma edge ring and is isolated from exposure to an exterior of the plasma edge ring in a vertical direction by the top surface of the plasma edge ring.

11. The plasma etching apparatus of claim 9, wherein the plasma edge ring has a circular shape when viewed in plan, and in a plan view, the placement hole has a tetragonal shape.

12. The plasma etching apparatus of claim 9, wherein the plasma edge ring includes:

a cover ring; and a capture ring on the cover ring, wherein the recess is in the capture ring.

* * * * *